US012757604B2

(12) United States Patent
Qu et al.

(10) Patent No.: US 12,757,604 B2
(45) Date of Patent: Oct. 6, 2026

(54) DISPLAY SUBSTRATE AND METHOD FOR MANUFACTURING THE SAME, AND DISPLAY APPARATUS

(71) Applicant: BOE TECHNOLOGY GROUP CO., LTD., Beijing (CN)

(72) Inventors: Caiyu Qu, Beijing (CN); Yanjun Hao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 646 days.

(21) Appl. No.: 18/247,321

(22) PCT Filed: May 30, 2022

(86) PCT No.: PCT/CN2022/096077
§ 371 (c)(1),
(2) Date: Mar. 30, 2023

(87) PCT Pub. No.: WO2023/230793
PCT Pub. Date: Dec. 7, 2023

(65) Prior Publication Data

US 2025/0089508 A1 Mar. 13, 2025

(51) Int. Cl.
*H10K 59/35* (2023.01)
*H10K 59/80* (2023.01)

(52) U.S. Cl.
CPC ......... *H10K 59/353* (2023.02); *H10K 59/352* (2023.02); *H10K 59/873* (2023.02); *H10K 59/879* (2023.02)

(58) Field of Classification Search
CPC .... H10K 59/87; H10K 59/8731; H10K 59/30; H10K 59/352; H10K 59/353; H10K 59/875; H10K 59/879
See application file for complete search history.

(56) References Cited

U.S. PATENT DOCUMENTS

2011/0084291 A1 4/2011 Jeong et al.
2017/0069871 A1 3/2017 Yim et al.
(Continued)

FOREIGN PATENT DOCUMENTS

CN 106981502 A 7/2017
CN 110265463 A 9/2019
(Continued)

*Primary Examiner* — Thanhha S Pham
(74) *Attorney, Agent, or Firm* — Dority & Manning, P.A.

(57) ABSTRACT

A display substrate includes a base, a light-emitting device layer and a light extraction layer disposed in sequence. The base includes first sub-pixel regions, second sub-pixel regions and third sub-pixel regions. The light-emitting device layer includes first light-emitting devices, second light-emitting devices and third light-emitting devices that emit light of different colors. The light extraction layer includes first light extraction portions, second light extraction portions and third light extraction portions. The first light extraction portion and first light-emitting device are located in the first sub-pixel region, the second light extraction portion and second light-emitting device are located in the second sub-pixel region, and the third light extraction portion and third light-emitting device are located in the third sub-pixel region. At least two of the first light extraction portion, the second light extraction portion and the third light extraction portion have different dimensions in a thickness direction of the base.

19 Claims, 20 Drawing Sheets

(56) References Cited

U.S. PATENT DOCUMENTS

| | | | |
|---|---|---|---|
| 2017/0117333 A1 | 4/2017 | Kikuchi et al. | |
| 2018/0301656 A1 | 10/2018 | Ji | |
| 2020/0161585 A1* | 5/2020 | Palles-Dimmock | G09G 3/2003 |
| 2021/0336184 A1 | 10/2021 | Xiang | |
| 2023/0143068 A1 | 5/2023 | Tong et al. | |

FOREIGN PATENT DOCUMENTS

| | | | |
|---|---|---|---|
| CN | 111384087 A | 7/2020 | |
| EP | 3193371 B1 * | 1/2022 | H10K 59/351 |

* cited by examiner

DISPLAY SUBSTRATE AND METHOD FOR MANUFACTURING THE SAME, AND DISPLAY APPARATUS

CROSS-REFERENCE TO RELATED APPLICATION

This application is a national phase entry under 35 USC 371 of International Patent Application No. PCT/CN2022/096077, filed on May 30, 2022, which is incorporated herein by reference in its entirety.

TECHNICAL FIELD

The present disclosure relates to the field of display technologies, and in particular, to a display substrate and a method for manufacturing the same, and a display apparatus.

BACKGROUND

With the development of display technologies, the transparent display technology has emerged. Due to the fact that a transparent display screen has light transmission in at least partial region, viewers can see the background behind the display screen clearly, and thus the transparent display screen is suitable for many scenarios such as building windows, automobile windows and shop windows.

SUMMARY

In an aspect, a display substrate is provided. The display substrate includes a base, a light-emitting device layer and a light extraction layer. The base includes first sub-pixel regions, second sub-pixel regions and third sub-pixel regions that display different colors. The light-emitting device layer is located on a side of the base, and the light-emitting device layer includes first light-emitting devices, second light-emitting devices and third light-emitting devices that emit light of different colors, a first light-emitting device in the first light-emitting devices is located in a first sub-pixel region in the first sub-pixel regions, a second light-emitting device in the second light-emitting devices is located in a second sub-pixel region in the second sub-pixel regions, and a third light-emitting device in the third light-emitting devices is located in a third sub-pixel region in the third sub-pixel regions. The light extraction layer is located on a side of the light-emitting device layer away from the base. The light extraction layer includes first light extraction portions, second light extraction portions and third light extraction portions, a first light extraction portion in the first light extraction portions is located in the first sub-pixel region, a second light extraction portion in the second light extraction portions is located in the second sub-pixel region, and a third light extraction portion in the third light extraction portions is located in the third sub-pixel region. At least two of the first light extraction portion, the second light extraction portion and the third light extraction portion have different dimensions in a thickness direction of the base.

In some embodiments, in the thickness direction of the base, a dimension of the first light extraction portion is greater than a dimension of the second light extraction portion, and the dimension of the second light extraction portion is greater than a dimension of the third light extraction portion.

In some embodiments, the light-emitting device layer includes an anode, a cathode layer, and an organic layer located between the anode and the cathode layer. The organic layer includes first organic layers, second organic layers and third organic layers that are made of different materials; a first organic layer in the first organic layers is located in the first sub-pixel region, a second organic layer in the second organic layers is located in the second sub-pixel region, and a third organic layer in the third organic layers is located in the third sub-pixel region. At least two of the first organic layer, the second organic layer and the third organic layer have different dimensions in the thickness direction of the base.

In some embodiments, in the thickness direction of the base, a dimension of the first organic layer is greater than a dimension of the second organic layer, and the dimension of the second organic layer is greater than a dimension of the third organic layer.

In some embodiments, surfaces, away from the base, of at least two of the first light extraction portion, the second light extraction portion and the third light extraction portion have different average distances from the base.

In some embodiments, surfaces, away from the base, of the first light extraction portion, the second light extraction portion and the third light extraction portion have different average distances from the base.

In some embodiments, an average distance between the base and a surface of the first light extraction portion away from the base is greater than an average distance between the base and a surface of the second light extraction portion away from the base, and the average distance between the base and the surface of the second light extraction portion away from the base is greater than an average distance between the base and a surface of the third light extraction portion away from the base.

In some embodiments, the light-emitting device layer includes a cathode layer. The cathode layer includes first cathode portions, second cathode portions and third cathode portions. A first cathode portion in the first cathode portions is located in the first sub-pixel region, a second cathode portion in the second cathode portions is located in the second sub-pixel region, and a third cathode portion in the third cathode portions is located in the third sub-pixel region. In the thickness direction of the base, a dimension of the first cathode portion, a dimension of the second cathode portion and a dimension of the third cathode portion are substantially equal.

In some embodiments, the base further includes a light-transmissive region located between the first sub-pixel region, the second sub-pixel region and the third sub-pixel region. The cathode layer further includes fourth cathode portions, a fourth cathode portion located in the light-transmissive region. In the thickness direction of the base, the dimension of the first cathode portion is greater than or substantially equal to a dimension of the fourth cathode portion.

In some embodiments, an orthographic projection of the light extraction layer on the base does not overlap with an orthographic projection of the fourth cathode portion on the base.

In some embodiments, the display substrate further includes an encapsulation layer covering the light extraction layer; the encapsulation layer is in direct contact with the fourth cathode portion.

In some embodiments, the display substrate further includes an encapsulation layer. The encapsulation layer includes first encapsulation portions, second encapsulation portions and third encapsulation portions. A first encapsulation portion in the first encapsulation portions is located in the first sub-pixel region, a second encapsulation portion in the second encapsulation portions is located in the second sub-pixel region, and a third encapsulation portion in the third encapsulation portions is located in the third sub-pixel region. At least two of the first encapsulation portion, the second encapsulation portion and the third encapsulation portion have different dimensions in the thickness direction of the base.

In some embodiments, the base further includes a light-transmissive region located between the first sub-pixel region, the second sub-pixel region and the third sub-pixel region. The encapsulation layer further includes a fourth encapsulation portion located in the light-transmissive region. In the thickness direction of the base, a dimension of the fourth encapsulation portion is greater than each of a dimension of the first encapsulation portion, a dimension of the second encapsulation portion and a dimension of the third encapsulation portion.

In some embodiments, two sub-pixel regions displaying a same color are adjacently arranged, and a light-transmissive region is provided between the two sub-pixel regions that are adjacently arranged. One of the first light extraction portion, the second light extraction portion and the third light extraction portion covers the two sub-pixel regions displaying the same color and the light-transmissive region located between the two sub-pixel regions.

In some embodiments, the two sub-pixel regions displaying the same color and the light-transmissive region located between the two sub-pixel regions each have an organic layer and a cathode portion therein. A material of an organic layer in the light-transmissive region is the same as a material of organic layers in the two sub-pixel regions displaying the same color.

In yet another aspect, a display apparatus is provided. The display apparatus includes the display substrate as described in any one of the above embodiments.

In yet another aspect, a method for manufacturing a display substrate is provided. The method includes: providing a base, the base including first sub-pixel regions, second sub-pixel regions, third sub-pixel regions, and a light-transmissive region, located between a first sub-pixel region in the first sub-pixel regions, a second sub-pixel region in the second sub-pixel regions and a third sub-pixel region in the third sub-pixel regions; forming a light-emitting device layer on the base, the light-emitting device layer including first light-emitting devices, second light-emitting devices and third light-emitting devices, a first light-emitting device in the first light-emitting devices being located in the first sub-pixel region, a second light-emitting device in the second light-emitting devices being located in the second sub-pixel region, and a third light-emitting device in the third light-emitting devices being located in the third sub-pixel region; and forming a light extraction layer on a side of the light-emitting device layer away from the base, the light extraction layer including first light extraction portions, second light extraction portions and third light extraction portions, a first light extraction portion in the first light extraction portions being located in the first sub-pixel region, a second light extraction portion in the second light extraction portions being located in the second sub-pixel region, and a third light extraction portion in the third light extraction portions being located in the third sub-pixel region. At least two of the first light extraction portion, the second light extraction portion and the third light extraction portion have different dimensions in a thickness direction of the base.

In some embodiments, forming the light extraction layer includes: forming a first light extraction film on the side of the light-emitting device layer away from the base, the first light extraction film being located in the first sub-pixel regions, the second sub-pixel regions and the third sub-pixel regions; and forming a second light extraction film on a side of the first light extraction film away from the base, the second light extraction film covering one or two kinds of the first sub-pixel regions, the second sub-pixel regions and the third sub-pixel regions.

In some embodiments, forming a first cathode material layer on the base, the first cathode material layer covering the first sub-pixel regions, the second sub-pixel regions, the third sub-pixel regions and the light-transmissive region; forming, on the first cathode material layer, a first isolation column located in the light-transmissive region; and forming a second cathode material layer on a side, away from the base, of the first isolation column and the first cathode material layer, the second cathode material layer including a cathode film and a cathode sacrificial layer, the cathode film covering the first sub-pixel regions, the second sub-pixel regions and the third sub-pixel regions, and the cathode sacrificial layer covering the first isolation column: the first isolation column separating portions of the cathode film in two adjacent sub-pixel regions.

In some embodiments, forming the light extraction layer includes: forming a first light extraction material layer, the first light extraction material layer including a first light extraction film and a first sacrificial film, the first light extraction film being located in the first sub-pixel regions, the second sub-pixel regions and the third sub-pixel regions, the first sacrificial film covering the cathode sacrificial layer, and the first isolation column separating the first light extraction film and the first sacrificial film: forming, on the first light extraction material layer, second isolation columns located in the third sub-pixel regions; forming a second light extraction material layer, the second light extraction material layer including a second light extraction film and a second sacrificial film, the second light extraction film being located in the first sub-pixel regions and the second sub-pixel regions, and the second sacrificial film covering the first sacrificial film and the second isolation columns, and the second isolation columns separating the second light extraction film and the second sacrificial film; and removing the first isolation column, the second isolation columns, the cathode sacrificial layer and the first sacrificial film that cover the first isolation column, and the second sacrificial film that covers the second isolation columns, so as to form first light extraction portions located in the first sub-pixel regions, second light extraction portions located in the second sub-pixel region and third light extraction portions located in the third sub-pixel region.

In some embodiments, after forming the second light extraction material layer, forming the light extraction layer further includes: forming, on the second light extraction material layer, third isolation columns located in the second sub-pixel regions; and forming a third light extraction material layer, the third light extraction material layer including a third light extraction film and a third sacrificial film, the third light extraction film being located in the first sub-pixel regions, and the third sacrificial film covering the second sacrificial film and the third isolation columns, the third isolation columns separating the third light extraction film and the third sacrificial film.

Removing the first isolation column, the second isolation columns, the cathode sacrificial layer and the first sacrificial film that cover the first isolation column, and the second sacrificial film that covers the second isolation columns, includes: removing the first isolation column, the second isolation columns, the third isolation columns, the cathode sacrificial layer and the first sacrificial film that cover the first isolation column, the second sacrificial film that covers the second isolation columns, and the third sacrificial film that covers the third isolation columns.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings. In addition, accompanying drawings in the following description may be regarded as schematic diagrams, and are not limitations on an actual size of a product, an actual process of a method and an actual timing of signals involved in the embodiments of the present disclosure.

DETAILED DESCRIPTION

Figure 1:
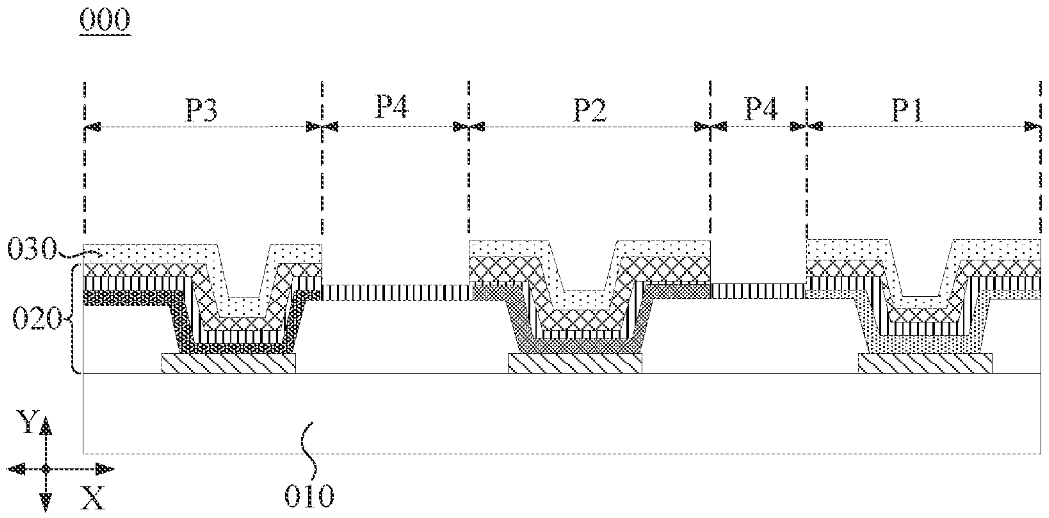
FIG. 1 is a structural diagram of a display substrate, in accordance with some embodiments.

Technical solutions in some embodiments of the present disclosure will be described clearly and completely below with reference to the accompanying drawings. However, the described embodiments are merely some but not all of embodiments of the present disclosure. All other embodiments obtained based on the embodiments of the present disclosure by a person of ordinary skill in the art shall be included in the protection scope of the present disclosure.

Unless the context requires otherwise, throughout the specification and the claims, the term “comprise” and other forms thereof such as the third-person singular form “comprises” and the present participle form “comprising” are construed as an open and inclusive meaning, i.e., “including, but not limited to”. In the description of the specification, the term such as “one embodiment”, “some embodiments”, “exemplary embodiments”, “example”, “specific example” or “some examples” are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as “first” and “second” are used for descriptive purposes only, but are not to be construed as indicating or implying the relative importance or implicitly indicating the number of indicated technical features. Thus, a feature defined with “first” or “second” may explicitly or implicitly include one or more of the features. In the description of the embodiments of the present disclosure, the terms “a plurality of” “the plurality of” and “multiple” each mean two or more unless otherwise specified.

In the description of some embodiments, the terms “coupled” and “connected” and derivatives thereof may be used. For example, the term “connected” may be used in the description of some embodiments to indicate that two or more components are in direct physical or electrical contact with each other. As another example, the term “coupled” may be used in the description of some embodiments to indicate that two or more components are in direct physical or electrical contact. However, the term “coupled” or “communicatively coupled” may also mean that two or more components are not in direct contact with each other, but still cooperate or interact with each other. The embodiments disclosed herein are not necessarily limited to the context herein.

The phrase “at least one of A, B and C” has a same meaning as the phrase “at least one of A, B or C”, and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phase "applicable to" or "configured to" used herein means an open and inclusive expression, which does not exclude devices that are applicable to or configured to perform additional tasks or steps.

In addition, the phase "based on" used is meant to be open and inclusive, since a process, step, calculation or other action that is "based on" one or more of the stated conditions or values may, in practice, be based on additional conditions or values exceeding those stated.

As used herein, terms such as "about", "substantially" or "approximately" include a stated value and an average value within an acceptable range of deviation of a particular value. The acceptable range of deviation is determined by a person of ordinary skill in the art in view of the measurement in question and the error associated with measurement of a particular quantity (i.e., the limitation of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

In some technical solutions, as shown in FIG. 1, a display substrate 000 includes a base substrate 010, a light-emitting functional layer 020 located on the base substrate 010, and a light extraction layer 030 located on the light-emitting functional layer 020. The light extraction layer 030 covers first sub-pixel regions P1, second sub-pixel regions P2 and third sub-pixel regions P3. The light extraction layer 030 has a uniform dimension in a thickness direction of the base substrate 010 (in a second direction Y, a layer having a same dimension in the second direction Y is represented by a same pattern in the figure). That is, the light extraction layer 030 is of a thin film structure having the same thickness (the same dimension in the second direction Y) at all positions.

Figure 2:
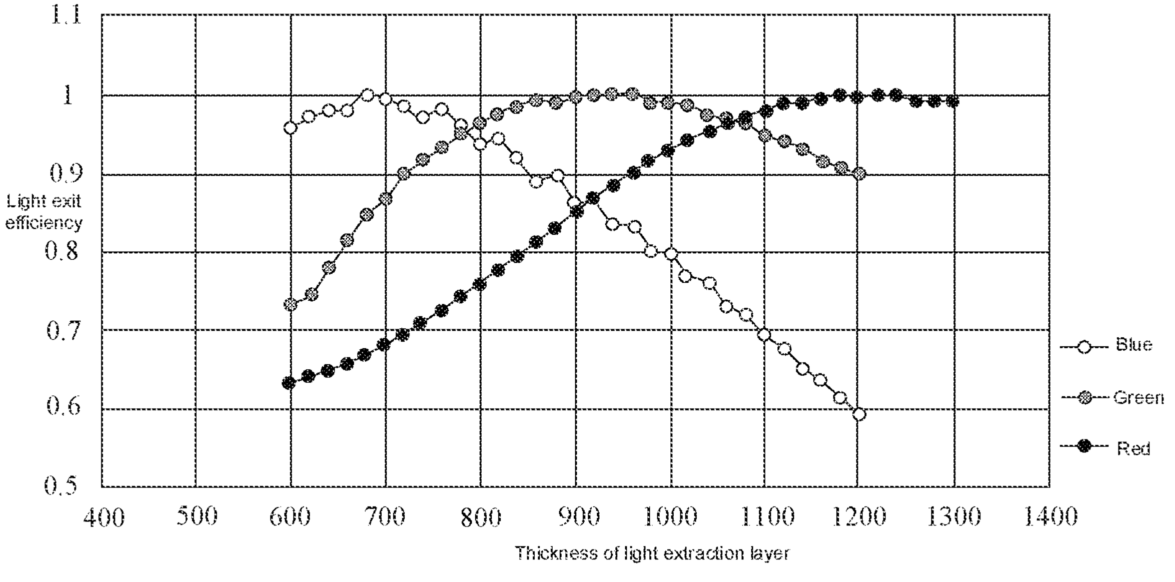
FIG. 2 is a graph showing light exit efficiencies for red light, green light and blue light at different thicknesses of light extraction layers.

However, the inventors of the present disclosure have found that, light-emitting devices of different colors at respective optimum light exit efficiencies correspond to light extraction layers 030 with different thicknesses (as shown in FIG. 2). Therefore, the use of the light extraction layer 030 having the uniform thickness has a problem that a light exit efficiency of a display panel is low.

In light of this, some embodiments of the present disclosure provide a display substrate, a display panel and a display apparatus, each of which will be described below.

Figure 3:
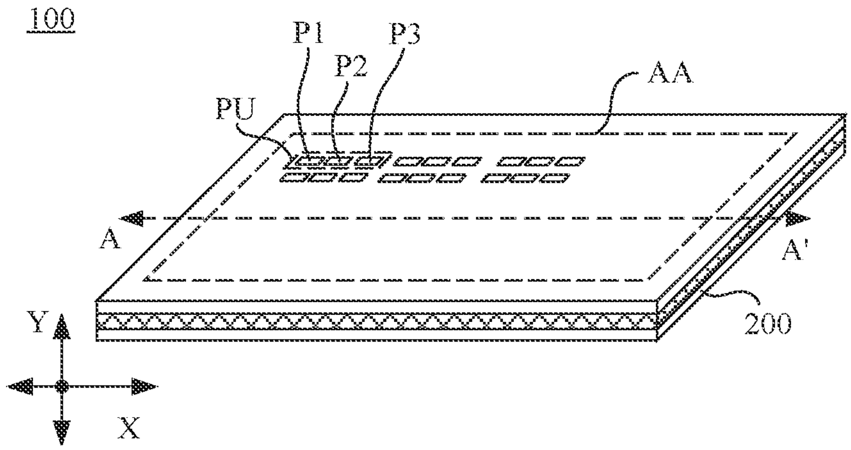
FIG. 3 is a structural diagram of a display panel, in accordance with some embodiments.
Figure 4:
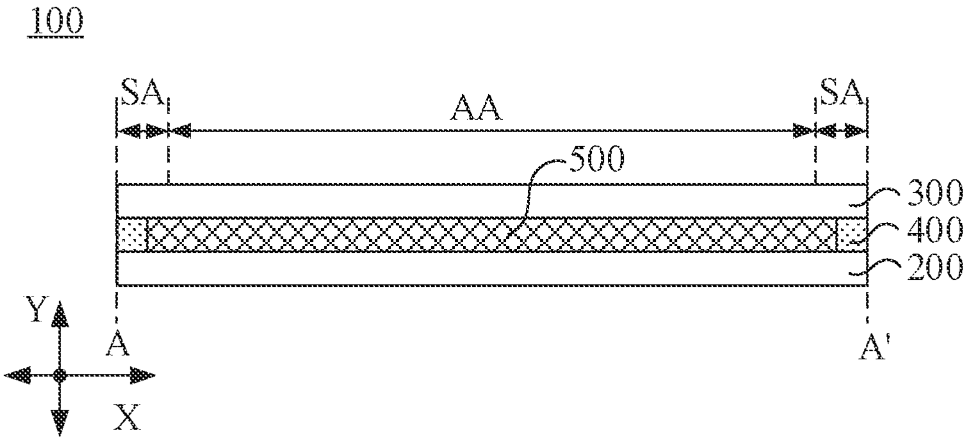
FIG. 4 is a sectional view taken along the line A-A' in FIG. 3.

FIG. 3 is a three-dimensional view of the display panel, in accordance with some embodiments; and FIG. 4 is a schematic sectional view of taken along the line A-A', in accordance with the display panel in embodiments shown in FIG. 3. As shown in FIGS. 3 and 4, the display panel 100 includes the display substrate 200 and a color conversion substrate 300. The display panel 100 has a display area AA for displaying an image and a non-display area SA in which no image is displayed, and the non-display area SA is located at at least one side of the display area AA. In some examples, the non-display area SA may encircle the display area AA, or may be located outside the display area AA in at least one direction. The display panel 100 further includes: a sealing layer 400 for sealing a space between the display substrate 200 and the color conversion substrate 300, and a filling layer 500 filled between the display substrate 200 and the color conversion substrate 300.

The display panel 100 in a plan view may be in a shape of rectangle, a circle, an ellipse, a rhombus, a trapezoid, a square or other shape depending to display requirements.

The display apparatus includes the display panel 100. For example, the display apparatus may be a small and medium sized electronic apparatus such as a tablet computer, a smart phone, a head-mounted display, an automobile navigation unit, a camera, a central information display (CID) provided in a vehicle, a wristwatch-type electronic apparatus or any other wearable device, a personal digital assistant (PDA), a portable multimedia player (PMP) and a game console, and a medium and large sized electronic apparatus such as a television, an external billboard, a monitor, a home appliance including a display screen, a personal computer and a laptop computer. The electronic apparatuses described above may merely represent examples of the application of the display apparatus. However, a person of ordinary skill in the art can recognize that the display apparatus may be any other electronic apparatus without departing from the spirit and scope of the present disclosure.

The color conversion substrate 300 may be disposed opposite to the display substrate 200. The color conversion substrate 300 may include color conversion structure(s) for converting a color of incident light. The color conversion structure may include at least one of a color filter and a wavelength conversion pattern.

The sealing layer 400 may be located between the display substrate 200 and the color conversion substrate 300 and in the non-display area SA. The sealing layer 400 may be disposed in the non-display area SA along edges of the display substrate 200 and the color conversion substrate 300, so that the sealing layer 400 surrounds an edge of the display area AA or is at a periphery of the edge of the display area AA in plan view. The sealing layer 300 may be made of an organic material such as epoxy resin, which is not limited thereto.

The filling layer 500 may be located and filled in a space, surrounded by the sealing layer 400, between the display substrate 200 and the color conversion substrate 300. The filling layer 500 may be made of a material capable of transmitting light. The filling layer 500 may be made of an organic material such as a silicon-based organic material or an epoxy-based organic material, which is not limited thereto. In some embodiments, the filling layer 500 may be omitted.

The display panel 100 may be an organic light-emitting diode (OLED) display panel, a quantum dot light-emitting diode (QLED) display panel, or a micro light-emitting diode (micro LED) display panel, which is not specifically limited in the embodiments of the present disclosure.

The following embodiments of the present disclosure are all described by considering an example in which the display panel 100 is an OLED display panel, but it should not be construed as being limited to the OLED display panel.

Figure 5:
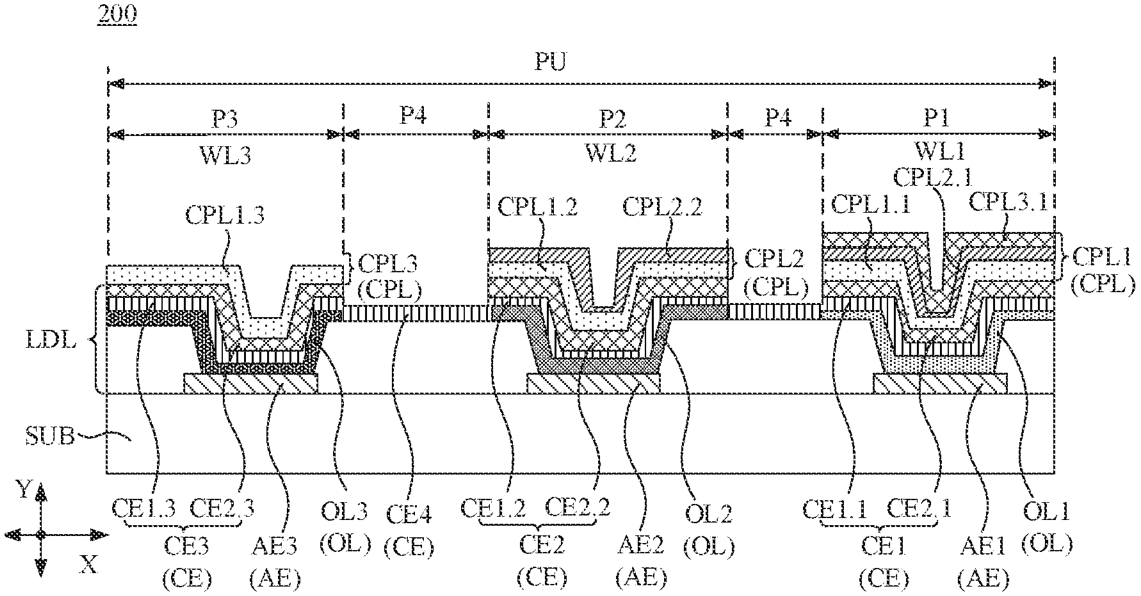
FIG. 5 is a structural diagram of a display substrate, in accordance with some embodiments.
Figure 6A:
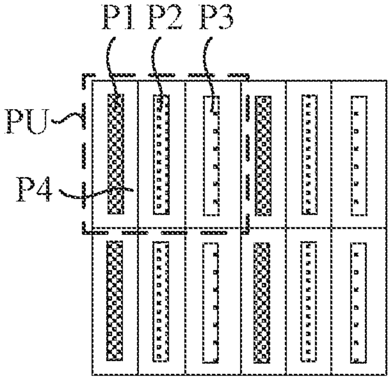
FIGS. 6A to 6C each are a diagram showing a positional arrangement of sub-pixel regions in a pixel unit region of a display substrate, in accordance with some embodiments.
Figure 6B:
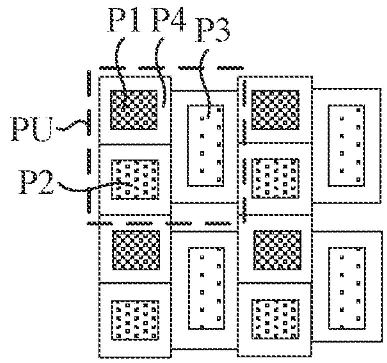
Figure 6C:
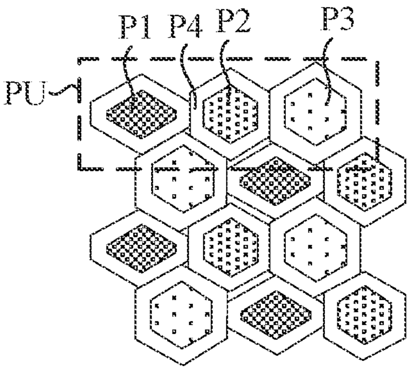
Figure 7:
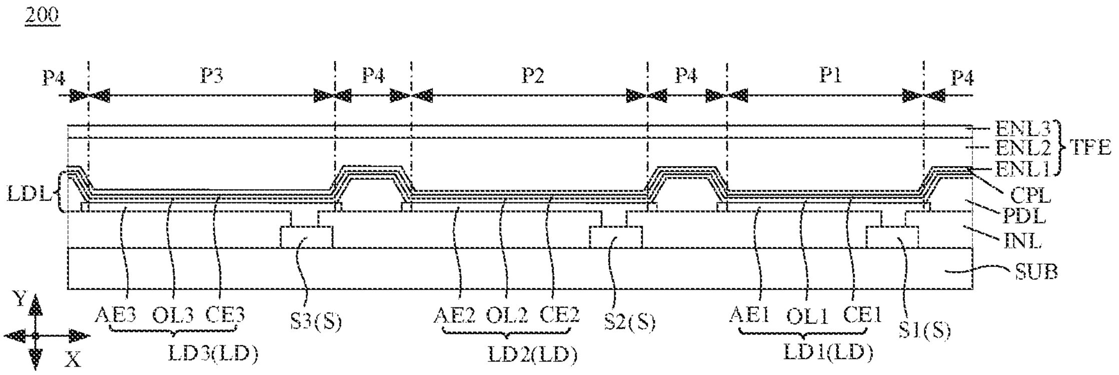
FIG. 7 is a structural diagram of a display substrate, in accordance with some embodiments.

As shown in FIGS. 5 to 7, some embodiments of the present disclosure provide a display substrate 200. The display substrate 200 includes a base SUB, a light-emitting device layer LDL and a light extraction layer CPL.

The base SUB includes a plurality of pixel unit regions PU that are repeatedly arranged. Each pixel unit region PU may include first sub-pixel region(s) P1, second sub-pixel region(s) P2 and third sub-pixel region(s) P3 that display different colors. For example, the first sub-pixel region P1 is configured to display red light, the second sub-pixel region P2 is configured to display green light, and the third sub-pixel region P3 is configured to display blue light.

In some examples, as shown in FIGS. 6A to 6C, the pixel unit region PU includes one first sub-pixel region P1, one second sub-pixel region P2 and one third sub-pixel region P3. The first sub-pixel region P1, the second sub-pixel region P2 and the third sub-pixel region P3 are arranged at intervals, and they are repeatedly arranged in the display area AA. In this case, a light-transmissive region P4 may be located between the first sub-pixel region P1 and the second sub-pixel region P2, between the second sub-pixel region P2 and the third sub-pixel region P3, and between the third sub-pixel region P3 and the first sub-pixel region P1.

In some examples, the pixel unit region PU includes one first sub-pixel region P1, two second sub-pixel regions P2 and one third sub-pixel region P3. The one first sub-pixel region P1, the two second sub-pixel regions P2 and the one third sub-pixel region P3 are arranged at intervals, and they are repeatedly arranged in the display area AA. In this case, the light-transmissive region P4 may further be located between the two second sub-pixel regions P2.

As shown in FIG. 5, in the pixel unit region PU and in a first direction X, the first sub-pixel region P1 has a first width WL1, the second sub-pixel region P2 has a second width WL2, and the third sub-pixel region P3 has a third width WL3. The first width WL1, the second width WL2 and the third width WL3 may be the same or different from each other, which is not limited in the present disclosure.

As shown in FIG. 7, the display substrate 200 may include a plurality of pixel circuits S located on a base substrate (i.e., the base) SUB. A first pixel circuit S1, a second pixel circuit S2 and a third pixel circuit S3 may be included in the pixel unit region PU. For example, the first pixel circuit S1 is located in the first sub-pixel region P1, the second pixel circuit S2 is located in the second sub-pixel region P2, and the third pixel circuit S3 is located in the third sub-pixel region P3. As another example, thin film transistors in at least one of the first pixel circuit S1, the second pixel circuit S2, and the third pixel circuit S3 may be located in the light-transmissive region P4.

Thin film transistors in at least one of the first pixel circuit S1, the second pixel circuit S2 and the third pixel circuit S3 may be thin film transistors including polysilicon or thin film transistors including oxide semiconductors. For example, in the case where the thin film transistors are the thin film transistors including the oxide semiconductors, the thin film transistor may have a top-gate thin film transistor structure. The thin film transistor may be connected to a signal line. The signal line is, but not limited to, a gate line, a data line and a power supply line.

As shown in FIG. 7, the display substrate 200 may include an insulating layer INL, which may be located on first pixel circuits S1, second pixel circuits S2 and third pixel circuits S3. The insulating layer INL may have a flat surface. The insulating layer INL may be formed from an organic layer. For example, a material of the insulating layer INL may include acrylic resin, epoxy resin, imide resin or ester resin. The insulating layer INL may have through holes exposing electrodes of the first pixel circuit S1, the second pixel circuit S2 and the third pixel circuit S3, so as to achieve electrical connection.

As shown in FIGS. 5 and 7, the display substrate 200 may include the light-emitting device layer LDL located on the base substrate SUB. A plurality of light-emitting devices LD connected to the pixel circuits S are formed in the light-emitting device layer LDL. Light-emitting devices LD in the pixel unit region PU are a first light-emitting device LD1, a second light-emitting device LD2 and a third light-emitting device LD3. For example, the first light-emitting device LD1 may be located in the first sub-pixel region P1, the second light-emitting device LD2 may be located in the second sub-pixel region P2, and the third light-emitting device LD3 may be located in the third sub-pixel region P3.

The first light-emitting device LD1 includes a first anode AE1, the second light-emitting device LD2 includes a second anode AE2, and the third light-emitting device LD3 includes a third anode AE3. The first anode AE1, the second anode AE2 and the third anode AE3 may be disposed on the insulating layer. The first anode AE1 may be located in the first sub-pixel region P1 and connected to the first pixel circuit S1 through a through hole of the insulating layer INL; the second anode AE2 may be located in the second sub-pixel region P2 and connected to the second pixel circuit S2 through a through hole of the insulating layer INL; and the third anode AE3 may be located in the third sub-pixel region P3 and connected to the third pixel circuit S3 through a through hole of the insulating layer INL. At least a portion of at least one of the first anode AE1, the second anode AE2 and the third anode AE3 may extend into the light-transmissive region P4. Widths or areas of the first anode AE1, the second anode AE2 and the third anode AE3 may be the same or different from each other. In some embodiments, a width of the first anode AE1 may be greater than a width of the second anode AE2, and the width of the second anode AE2 may be greater than a width of the third anode AE3. In some other embodiments, the first anode AE1, the second anode AE2 and the third anode AE3 may be reflective electrodes. The first anode AE1, the second anode AE2 and the third anode AE3 may each have a single-layer structure or a multi-layer structure, and may be made of metal (such as Ag, Mg, Al, Pt, Pd, Au, Ni, Nd, Ir or Cr) or a mixture thereof, or may be made of a conductive metal oxide material such as ITO, IZO or IGZO.

The display substrate 200 may further include a pixel defining layer PDL located on first anodes AE1, second anodes AE2 and third anodes AE3. In the pixel unit region PU, the pixel defining layer PDL may include light-emitting openings exposing the first anode AE1, the second anode AE2 and the third anode AE3, respectively. The light-emitting openings may define the first sub-pixel region P1, the second sub-pixel region P2, the third sub-pixel region P3 and the light-transmissive region P4, respectively. A material of the pixel defining layer PDL may be at least one of organic insulating materials such as acrylic resin, epoxy resin, phenolic resin, polyamide resin, polyimide resin, unsaturated polyester resin, polyphenylene resin, polyphenylene sulfide resin and benzocyclobutene (BCB).

As shown in FIGS. 5 and 7, the first light-emitting device LD1 further includes a first organic layer OL1, the second light-emitting device LD2 includes a second organic layer OL2, and the third light-emitting device LD3 includes a third organic layer OL3. The first organic layer OL1 may be located in the first sub-pixel region P1, the second organic layer OL2 may be located in the second sub-pixel region P2, and the third organic layer OL3 may be located in the third sub-pixel region P3.

Figure 8:
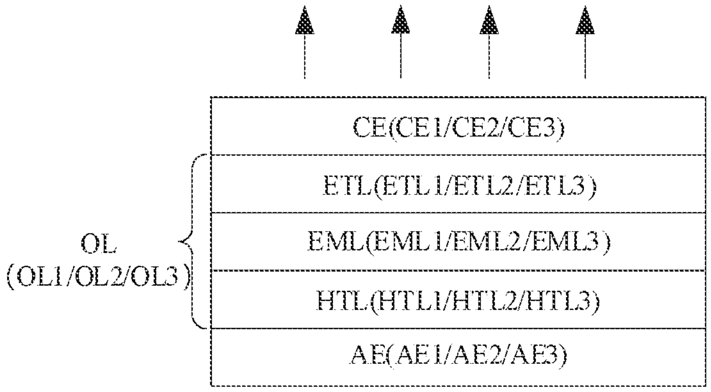
FIG. 8 is a structural diagram of a light-emitting device in a display substrate, in accordance with some embodiments.

The first organic layer OL1, the second organic layer OL2 and the third organic layer OL3 may include one or more stackable film layers that are formed in the first sub-pixel region P1, the second sub-pixel region P2 and the third sub-pixel region P3, respectively. The film layers are, for example, an electron transport layer, a light-emitting material layer and a hole transport layer. In some embodiments, as shown in FIG. 8, the first organic layer OL1 may include a first hole transport layer HTL1 located on the first anode AE1, a first light-emitting material layer EML1 located on the first hole transport layer HTL1, and a first electron transport layer ETL1 located on the first light-emitting material layer EML1; the first light-emitting material layer EML1 may be a red light-emitting layer. The second organic layer OL2 may include a second hole transport layer HTL2 located on the second anode AE2, a second light-emitting material layer EML2 located on the second hole transport layer HTL2, and a second electron transport layer ETL2 located on the second light-emitting material layer EML2; the second light-emitting material layer EML2 may be a green light-emitting layer. The third organic layer OL3 may include a third hole transport layer HTL3 located on the third anode AE3, a third light-emitting material layer EML3 located on the third hole transport layer HTL3, and a third electron transport layer ETL3 located on the third light-emitting material layer EML3; the third light-emitting material layer EML3 may be a blue light-emitting layer. First hole transport layers HTL1, second hole transport layers HTL2 and third hole transport layers HTL3 may be connected to each other to form a continuous film covering the first sub-pixel regions P1, the second sub-pixel regions P2, the third sub-pixel regions P3 and the light-transmissive region P4. Similarly, first electron transport layers ETL1, second electron transport layers ETL2 and third electron transport layers ETL3 may be connected to each other to form a continuous film covering the first sub-pixel regions P1, the second sub-pixel regions P2, the third sub-pixel regions P3 and the light-transmissive region P4.

Figure 16:
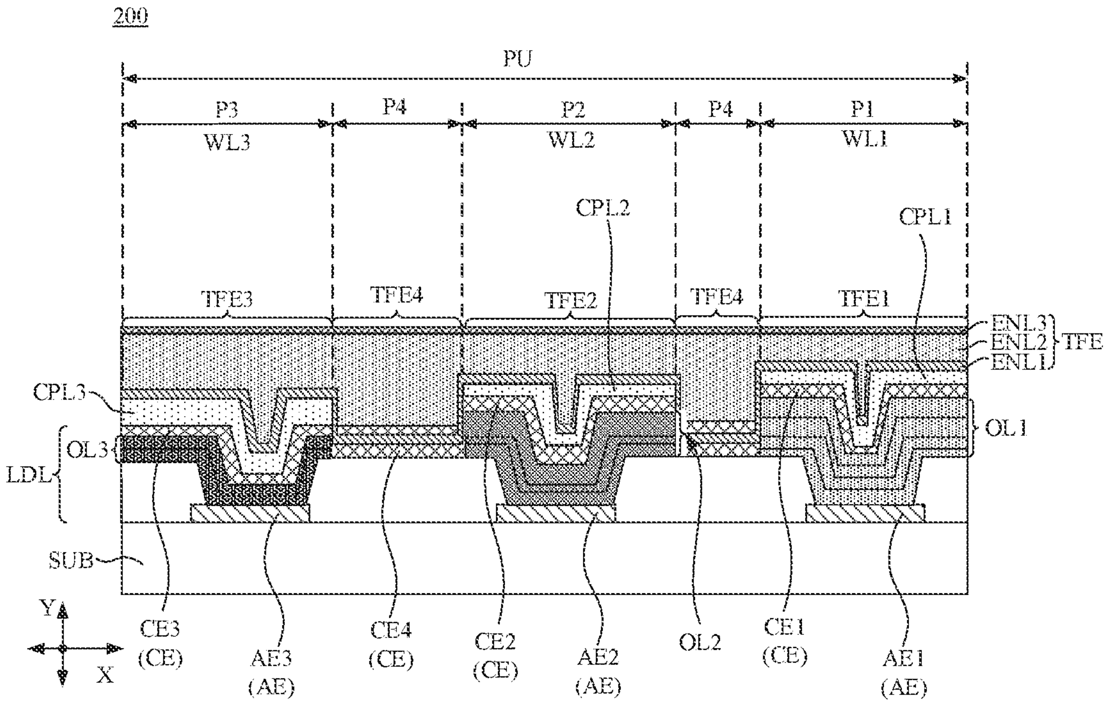
FIG. 16 is a structural diagram of a display substrate, in accordance with some embodiments.

As shown in FIG. 16, in some embodiments, at least two of the first organic layer OL1, the second organic layer OL2 and the third organic layer OL3 have different dimensions in a second direction Y (i.e., the thickness direction of the base substrate SUB). It will be understood that, at least two of a distance between the first anode AE1 and a first cathode portion CE1 in the first sub-pixel region P1, a distance between the second anode AE2 and a second cathode portion CE2 in the second sub-pixel region P2 and a distance between the third anode AE3 and a third cathode portion CE3 in the third sub-pixel region P3 are different from each other.

In some examples, in the second direction, a dimension of the first organic layer OL1 may be greater than a dimension of the second organic layer OL2, and the dimension of the second organic layer OL2 is substantially equal to a dimension of the third organic layer OL3. It will be understood that, the distance between the first anode AE1 and the first cathode portion CE1 in the first sub-pixel region P1 may be greater than the distance between the second anode AE2 and the second cathode portion CE2 in the second sub-pixel region P2, and the distance between the second anode AE2 and the second cathode portion CE2 in the second sub-pixel region P2 may be substantially equal to the distance between the third anode AE3 and the third cathode portion CE3 in the third sub-pixel region P3.

In some examples, in the second direction, the dimension of the first organic layer OL1, the dimension of the second organic layer OL2 and the dimension of the third organic layer OL3 are different from each other.

In some examples, the anode (the first anode, the second anode or the third anode) is the reflective electrode that can reflect light, and a cathode portion (the first cathode portion, the second cathode portion or the third cathode portion) is a transmissive electrode that can transmit light. In this way, a microcavity structure is formed between the anode and the cathode portion.

The inventors of the present disclosure have found through research that, in the second direction Y, a dimension of a microcavity structure corresponding to an optimum light exit efficiency for red light is greater than a dimension of a microcavity structure corresponding to an optimum light exit efficiency for green light, and the dimension of the microcavity structure corresponding to the optimum light exit efficiency for green light is greater than a dimension of a microcavity structure corresponding to an optimum light exit efficiency for blue light.

For example, in the second direction Y, the dimension of the first organic layer OL1 is greater than the dimension of the second organic layer OL2, and the dimension of the second organic layer OL2 is greater than the dimension of the third organic layer OL3. It will be understood that, the distance between the first anode AE1 and the first cathode portion CE1 in the first sub-pixel region P1 is greater than the distance between the second anode AE2 and the second cathode portion CE2 in the second sub-pixel region P2, and the distance between the second anode AE2 and the second cathode portion CE2 in the second sub-pixel region P2 is greater than the distance between the third anode AE3 and the third cathode portion CE3 in the third sub-pixel region P3.

In this case, it is possible to facilitate light exit efficiencies for red light, green light and blue light reaching respective optimum light exit efficiencies. As a result, a light exit efficiency of the display substrate 200 can be improved.

In some examples, there may be a case that a difference exists in dimensions of light-emitting material layers EML of the organic layers OL (the first organic layer OL1, the second organic layer OL2 and the third organic layer OL3) in the second direction, which causes a difference in dimensions of different organic layers OL in the second direction. It is not limited here.

As shown in FIGS. 5 and 7, there is a common cathode layer CE in first light-emitting devices LD1, second light-emitting devices LD2 and third light-emitting devices LD3. The cathode layer CE may be located in the first sub-pixel regions P1, the second sub-pixel regions P2, the third sub-pixel regions P3 and the light-transmissive region P4. The cathode layer CE may have semi-transmissive properties or transmissive properties. In some embodiments, a material of the cathode layer CE may include Ag, Mg, Cu, Al, Pt, Pd, Au, Ni, Nd, Ir, Cr, Li, Ca, LiF/Ca, LiF/Al, Mo, Ti or a compound or mixture thereof. For example, the material of the cathode layer CE may include a mixture of Ag and Mg. In some other embodiments, the material of the cathode layer CE may include transparent conductive oxide (TCO). For example, the material of the cathode layer CE may include tungsten oxide (WxOy), titanium oxide ($TiO_2$), indium tin oxide (ITO), indium zinc oxide (IZO), zinc oxide (ZnO), indium tin zinc oxide (ITZO) or magnesium oxide (MgO). In some embodiments, the display substrate 200 may further include an auxiliary cathode (not shown in the figures). The auxiliary cathode can reduce a resistance of the cathode layer CE, thereby ameliorating an IR drop problem of the cathode layer and improving the uniformity of a large-sized OLED display substrate.

As shown in FIG. 5, in the pixel unit region PU, the cathode layer CE may include the first cathode portion CE1, the second cathode portion CE2, the third cathode portion CE3 and a fourth cathode portion CE4 that are connected to each other. For example, the first cathode portion CE1 is located in the first sub-pixel region P1, the second cathode portion CE2 is located in the second sub-pixel region P2, the third cathode portion CE3 is located in the third sub-pixel region P3, and the fourth cathode portion CE4 is located in the light-transmissive region P4. The fourth cathode portion CE4 is connected to the first cathode portion CE1, the second cathode portion CE2 and the third cathode portion CE3 that are separated from each other.

In some embodiments, as shown in FIG. 5, in the second direction Y, a dimension of the first cathode portion CE1, a dimension of the second cathode portion CE2 and a dimension of the third cathode portion CE3 may be substantially equal.

In some examples, in the second direction Y, the dimension of the first cathode portion CE1, the dimension of the second cathode portion CE2, the dimension of the third cathode portion CE3 and a dimension of the fourth cathode portion CE4 are substantially equal.

In some examples, in the second direction Y, the dimension of the fourth cathode portion CE4 may be less than the dimension of any one of the first cathode portion CE1, the second cathode portion CE2 and the third cathode portion CE3. That is, there is at least one of the following cases: in the second direction Y, the dimension of the fourth cathode portion CE4 may be less than the dimension of the first cathode portion CE1; in the second direction Y, the dimension of the fourth cathode portion CE4 may be less than the dimension of the second cathode portion CE2; in the second direction Y, the dimension of the fourth cathode portion CE4 may be less than the dimension of the third cathode portion CE3.

Figure 9:
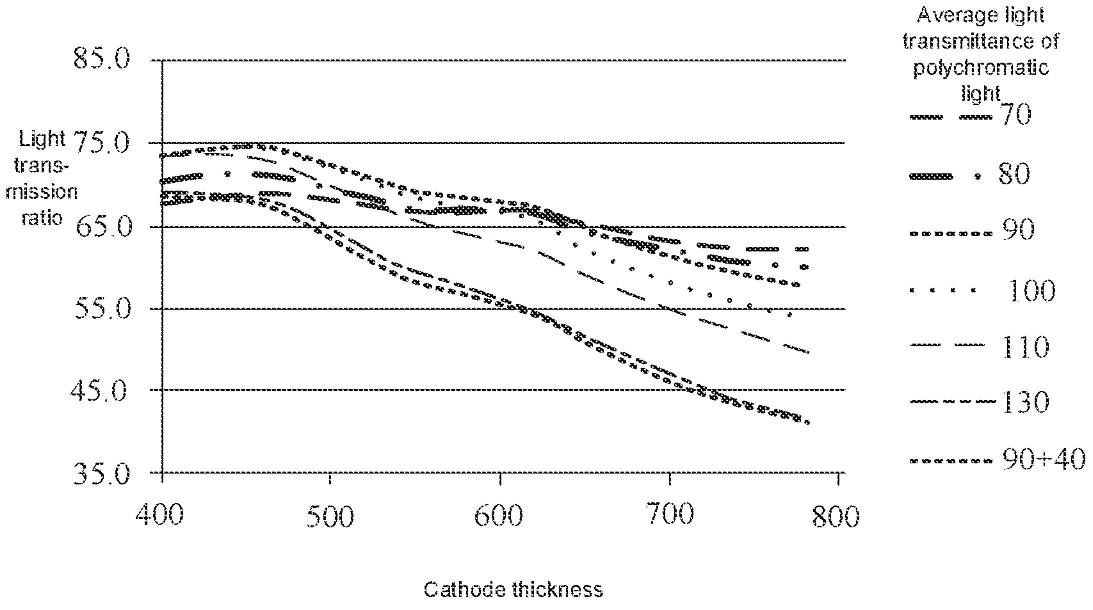
FIG. 9 is a graph showing light transmission of polychromatic light at different cathode thicknesses.
Figure 10:
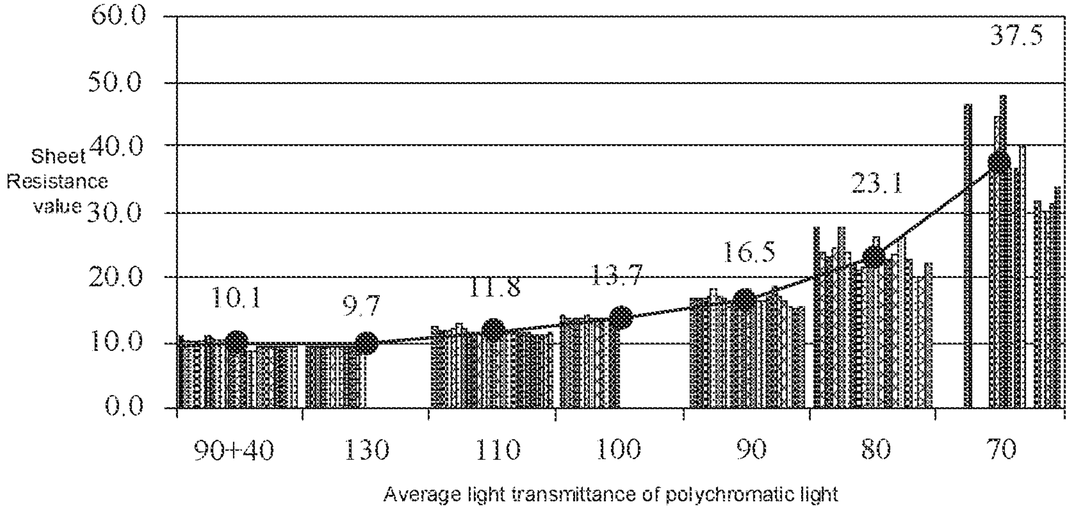
FIG. 10 is a graph showing cathode sheet resistances at different light transmittances.

The inventors of the present disclosure have found through research that, as shown in Table 1 and FIGS. 9 and 10, by considering a case where a dimension of the cathode layer CE in the second direction Y is 130 Å as a reference, as the dimension of the cathode layer CE in the second direction Y decreases, a ratio of red light (R Ratio), a ratio of green light (G Ratio) and a ratio of blue light (B Ratio) are changed, and full-band visible light transmittance (Tr ratio) increases accordingly, and a sheet resistance (Rs ratio) of the cathode layer CE also increases accordingly.

TABLE 1

| Cathode thickness | R ratio | G ratio | B ratio | Tr ratio | Rs ratio |
|---|---|---|---|---|---|
| 130 Å | 0.0% | 0.0% | 0.0% | 0.0% | 0.0% |
| 100 Å | −12.9% | −6.6% | −1.6% | 16.3% | 41.2% |
| 90 Å | −22.7% | −13.4% | −7.9% | 19.2% | 70.1% |

It can be seen from Table 1 that, compared with the case where the dimension of the cathode layer CE in the second direction Y (i.e., the cathode thickness) is 130 Å, in a case where the dimension of the cathode layer CE in the second direction Y is decreased to 90 Å, the Tr ratio is increased by 19.2%. However, the Rs ratio of the cathode layer CE is increased, which will degrade a performance of the light-emitting device.

It can be seen from FIGS. 9 and 10 that, as the dimension of the cathode layer CE in the second direction Y increases, a light transmittance of the cathode layer CE for light of different colors decreases accordingly, and the increase in the light transmittance of the cathode layer CE leads to an increase in the sheet resistance of the cathode layer CE accordingly.

In the embodiments, in the second direction Y, the dimension of the fourth cathode portion CE4 is less than a dimension of a cathode portion (e.g., the first cathode portion CE1) in each sub-pixel region. In this case, it is possible to increase a light transmittance of the light-transmissive region P4 to improve a light-transmissive performance of the display substrate 200; and it is also possible to ensure light exit efficiencies of the light-emitting devices in the sub-pixel regions by setting dimensions of the first cathode portion CE1, the second cathode portion CE2 and the third cathode portion CE3 in the second direction Y.

In the examples, the light exit efficiency of the display substrate 200 can be increased on a basis of improving the light-transmissive performance of the display substrate 200.

As shown in FIGS. 5 and 7, in some embodiments, an average distance between the base substrate SUB and a surface of the first cathode portion CE1 away from the base substrate SUB may be substantially equal to an average distance between the base substrate SUB and a surface of the second cathode portion CE2 away from the base substrate SUB, and may be substantially equal to an average distance between the base substrate SUB and a surface of the third cathode portion CE3 away from the base substrate SUB. The following description is made based on the embodiments.

In some embodiments, the dimension of the fourth cathode portion CE4 in the second direction Y may be in a range of 50 Å to 100 Å, such as 50 Å, 60 Å, 70 Å, 80 Å, 90 Å or 100 Å.

In some embodiments, a dimension of at least one of the first cathode portion CE1, the second cathode portion CE2 and the third cathode portion CE3 in the second direction Y may be in a range of 60 Å to 200 Å, such as 60 Å, 80 Å, 100 Å, 120 Å, 140 Å, 160 Å, 180 Å or 200 Å.

In some embodiments, as shown in FIGS. 5 and 7, the light extraction layer CPL may be disposed on a side of the plurality of light-emitting devices LD away from the base substrate SUB, which increases a light exit rate. A material of the light extraction layer CPL is generally an organic material having a large refractive index and a small light absorption coefficient.

In the pixel unit region PU, the light extraction layer CPL includes a first light extraction portion CPL1, a second light extraction portion CPL2 and a third light extraction portion CPL3. The first light extraction portion CPL1 is located in the first sub-pixel region P1, the second light extraction portion CPL2 is located in the second sub-pixel region P2, and the third light extraction portion CPL3 is located in the third sub-pixel region P3.

In the first pixel sub-region P1, the first light extraction portion CPL1 may be located directly on the first cathode portion CE1. In the second pixel sub-region P2, the second light extraction portion CPL2 may be located directly on the second cathode portion CE2. In the third pixel sub-region P3, the third light extraction portion CPL3 may be located directly on the third cathode portion CE3.

A dimension of at least one of the first light extraction portion CPL1, the second light extraction portion CPL2 and the third light extraction portion CPL3 in the second direction Y is in a range of 500 Å to 1500 Å, such as 500 Å, 550 Å, 600 Å, 650 Å, 700 Å, 750 Å, 800 Å, 850 Å, 900 Å, 950 Å, 1000 Å, 1050 Å, 1100 Å, 1200 Å, 1300 Å, 1400 Å or 1500 Å.

The inventors of the present disclosure have found through research that, a thickness (e.g., 900 Å) of a light extraction portion corresponding to the optimum light exit efficiency for red light is greater than a thickness (e.g., 650 Å) of a light extraction portion corresponding to the optimum light exit efficiency for green light, and the thickness of the light extraction portion corresponding to the optimum light exit efficiency for green light is greater than a thickness (e.g., 550 Å) of a light extraction portion corresponding to the optimum light exit efficiency for blue light. The dimension of at least one of the first light extraction portion CPL1, the second light extraction portion CPL2 and the third light extraction portion CPL3 in the second direction Y is in the range of 500 Å to 1500 Å, inclusive, which enables a thickness of the at least one of the first light extraction portion CPL1, the second light extraction portion CPL2 and the third light extraction portion CPL3 to approach or even conform to a thickness of a light extraction layer CPL corresponding to its optimum light exit efficiency, thereby improving the light exit efficiency of the display substrate.

In some embodiments, in the second direction Y, at least two of a dimension of the first light extraction portion CPL1, a dimension of the second light extraction portion CPL2 and a dimension of the third light extraction portion CPL3 may be different.

In some examples, in the second direction Y, the dimension of the second light extraction portion CPL2 is substantially equal to the dimension of the third light extraction portion CPL3, and is less than the dimension of the first light extraction portion CPL1.

It will be understood that, an average distance between the base substrate SUB and a surface of the second light extraction portion CPL2 away from the base substrate SUB is substantially equal to an average distance between the base substrate SUB and a surface of the third light extraction portion CPL3 away from the base substrate SUB, and is less than an average distance between the base substrate SUB and a surface of the first light extraction portion CPL1 away from the base substrate SUB.

For example, in the second direction Y, the dimension of the second light extraction portion CPL2 and the dimension of the third light extraction portion CPL3 are both 650 Å, and the dimension of the first light extraction portion CPL1 is 900 Å. In this case, light exit efficiencies for red light and green light reach respective optimum light exit efficiencies, and thus the light exit efficiency of the display substrate 200 can be improved.

As another example, in the second direction Y, the dimension of the second light extraction portion CPL2 and the dimension of the third light extraction portion CPL3 are both 550 Å, and the dimension of the first light extraction portion CPL1 is 900 Å. In this case, light exit efficiencies for red light and blue light reach respective optimum light exit efficiencies, and thus the light exit efficiency of the display substrate 200 can be improved.

In some examples, in the second direction Y, the dimension of the first light extraction portion CPL1 is substantially equal to the dimension of the second light extraction portion CPL2, and is greater than the dimension of the third light extraction portion CPL3.

It will be understood that, the average distance between the base substrate SUB and the surface of the first light extraction portion CPL1 away from the base substrate SUB is substantially equal to the average distance between the base substrate SUB and the surface of the second light extraction portion CPL2 away from the base substrate SUB, and is greater than the average distance between the base substrate SUB and the surface of the third light extraction portion CPL3 away from the base substrate SUB.

For example, in the second direction Y, the dimension of the first light extraction portion CPL1 and the dimension of the second light extraction portion CPL2 are both 900 Å, and the dimension of the third light extraction portion CPL3 is 550 Å. In this case, the light exit efficiencies for red light and blue light reach respective optimum light exit efficiencies, and thus the light exit efficiency of the display substrate 200 can be improved.

As another example, in the second direction Y, the dimension of the first light extraction portion CPL1 and the dimension of the second light extraction portion CPL2 are both 650 Å, and the dimension of the third light extraction portion CPL3 is 550 Å. In this case, light exit efficiencies for green light and blue light reach respective optimum light exit efficiencies, and thus the light exit efficiency of the display substrate 200 can be improved.

In some examples, in the second direction Y, the dimension of the first light extraction portion CPL1 is substantially equal to the dimension of the third light extraction portion CPL3, and is greater than the dimension of the second light extraction portion CPL2.

Itwill be understood that, the average distance between the base substrate SUB and the surface of the first light extraction portion CPL1 away from the base substrate SUB is substantially equal to the average distance between the base substrate SUB and the surface of the third light extraction portion CPL3 away from the base substrate SUB, and is greater than the average distance between the base substrate SUB and the surface of the second light extraction portion CPL2 away from the base substrate SUB.

For example, in the second direction Y, the dimension of the first light extraction portion CPL1 and the dimension of the third light extraction portion CPL3 are both 900 Å, and the dimension of the second light extraction portion CPL2 is 650 Å. In this case, the light exit efficiencies for red light and green light reach respective optimum light exit efficiencies, and thus the light exit efficiency of the display substrate 200 can be improved.

In some embodiments, in the second direction Y, the dimension of the first light extraction portion CPL1, the dimension of the second light extraction portion CPL2 and the dimension of the third light extraction portion CPL3 may be different from each other.

It will be understood that, the average distance between the base substrate SUB and the surface of the first light extraction portion CPL1 away from the base substrate SUB, the average distance between the base substrate SUB and the surface of the second light extraction portion CPL2 away from the base substrate SUB, and the average distance between the base substrate SUB and the surface of the third light extraction portion CPL3 away from the base substrate SUB are not equal to each other.

In some examples, in the second direction Y, the dimension of the first light extraction portion CPL1 is greater than the dimension of the third light extraction portion CPL3, and the dimension of the third light extraction portion CPL3 is greater than the dimension of the second light extraction portion CPL2.

It will be understood that, the average distance between the base substrate SUB and the surface of the first light extraction portion CPL1 away from the base substrate SUB is greater than the average distance between the base substrate SUB and the surface of the third light extraction portion CPL3 away from the base substrate SUB, and the average distance between the base substrate SUB and the surface of the third light extraction portion CPL3 away from the base substrate SUB is greater than the average distance between the base substrate SUB and the surface of the second light extraction portion CPL2 away from the base substrate SUB.

For example, the dimension of the first light extraction portion CPL1 in the second direction Y is 900 Å, the dimension of the third light extraction portion CPL3 in the second direction Y is 700 Å, and the dimension of the second light extraction portion CPL2 in the second direction Y is 650 Å. In this case, the light exit efficiencies for red light and green light reach respective optimum light exit efficiencies, and thus the light exit efficiency of the display substrate 200 can be improved.

In some examples, as shown in FIG. 5, in the second direction Y, the dimension of the first light extraction portion CPL1 is greater than the dimension of the second light extraction portion CPL2, and the dimension of the second light extraction portion CPL2 is greater than the dimension of the third light extraction portion CPL3.

It will be understood that, the average distance between the base substrate SUB and the surface of the first light extraction portion CPL1 away from the base substrate SUB is greater than the average distance between the base substrate SUB and the surface of the second light extraction portion CPL2 away from the base substrate SUB, and the average distance between the base substrate SUB and the surface of the second light extraction portion CPL2 away from the base substrate SUB is greater than the average distance between the base substrate SUB and the surface of the third light extraction portion CPL3 away from the base substrate SUB.

For example, the dimension of the first light extraction portion CPL1 in the second direction Y is 900 Å, the dimension of the second light extraction portion CPL2 in the second direction Y is 650 Å, and the dimension of the third light extraction portion CPL3 in the second direction Y is 550 Å. In this case, light exit efficiencies for red light, green light and blue light reach respective optimum light exit efficiencies, and thus the light exit efficiency of the display substrate 200 is improved.

TABLE 2

| Test data | Thickness of light extraction portion (CPL1/CPL2/CPL3) | Light exit efficiency of white light |
|---|---|---|
| Reference structure | 650 Å | 100% |
| Structure in the examples | 900 Å/650 Å/550 Å | 108% |

As shown in Table 2, by considering a case where a thickness of the light extraction portion is 650 Å as a reference, a structure in the examples in which the dimension of the first light extraction portion CPL1 in the second direction Y is 900 Å, the dimension of the second light extraction portion CPL2 in the second direction Y is 650 Å and the dimension of the third light extraction portion CPL3 in the second direction Y is 550 Å can improve the light exit efficiency of white light by 8%.

In some embodiments, as shown in FIG. 5, the light extraction layer CPL is not located in the light-transmissive region P4. That is, the light extraction portions are arranged independently of each other. The fourth cathode portion CE4 is located in the light-transmissive region P4. It will be understood that an orthographic projection of the fourth cathode portion CE4 on the base substrate SUB does not overlap with an orthographic projection of the light extraction layer CPL on the base substrate SUB.

Figure 11:
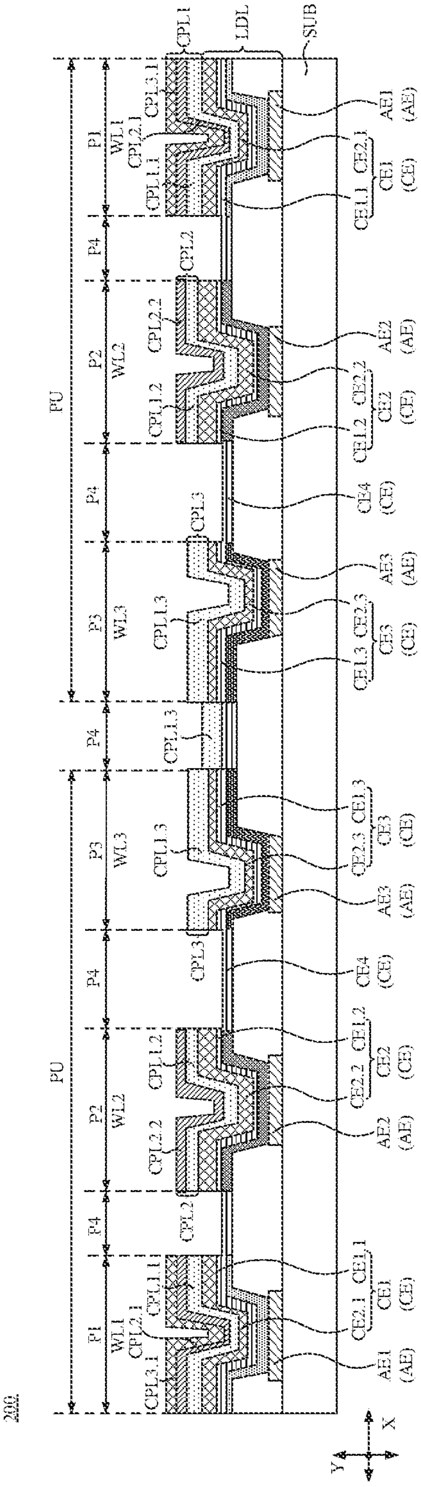
FIG. 11 is a structural diagram of a display substrate, in accordance with some embodiments.
Figure 13:
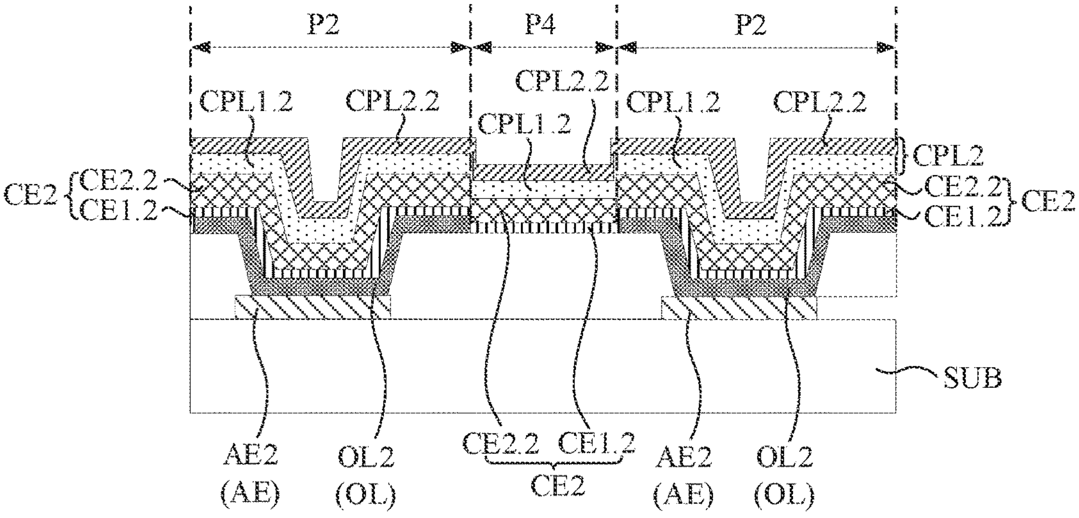
FIG. 13 is a structural diagram of a display substrate, in accordance with some embodiments.

In some embodiments, as shown in FIGS. 11 and 13, two sub-pixel regions displaying a same color are adjacently arranged. One light extraction portion covers two sub-pixel regions displaying the same color and a light-transmissive region located between the two sub-pixel regions.

In some examples, as shown in FIG. 11, in two pixel unit regions PU disposed adjacently, two sub-pixel regions displaying the same color may be adjacently arranged. By considering an example in which the pixel unit region includes a red sub-pixel region R, a green sub-pixel region G and a blue sub-pixel region B, pixel unit regions may be sequentially arranged in an order of RGBBGRRGB . . . . In this case, the display substrate 200 may include blue sub-pixel regions B arranged adjacently, and may further include red sub-pixel regions R arranged adjacently.

As shown in FIG. 11, a third light extraction portion CPL3 covers two adjacent third sub-pixel regions P3 and a light-transmissive region P4 between the two third sub-pixel regions P3. No light extraction layer CPL exists in a light-transmissive region P4 between two sub-pixel regions of different colors.

Figure 12A:
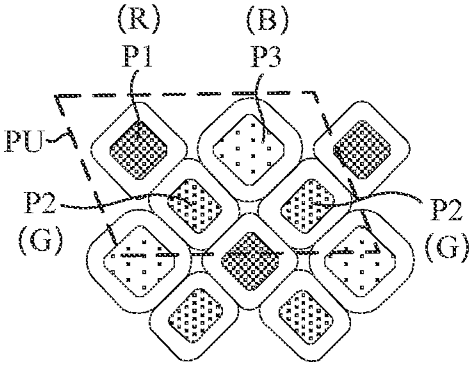
FIGS. 12A and 12B each area diagram showing a positional arrangement of sub-pixel regions in a pixel unit region of a display substrate, in accordance with some embodiments.
Figure 12B:
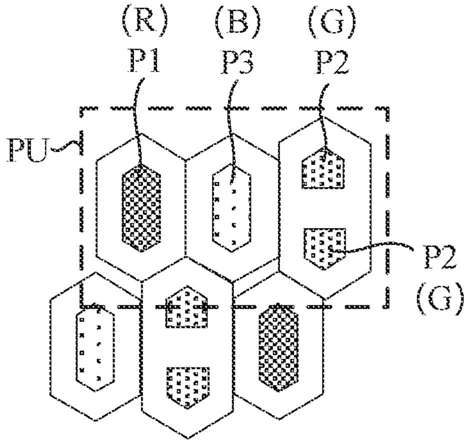

In some examples, as shown in FIGS. 12A and 12B, the pixel unit region PU may include two sub-pixel regions displaying the same color, and the two sub-pixel regions displaying the same color may be adjacently arranged. For example, the pixel unit region PU includes one red sub-pixel region R, two green sub-pixel regions G and one blue sub-pixel region B, and the two green sub-pixel regions G in the pixel unit region PU are adjacently arranged.

For example, as shown in FIG. 13, two second sub-pixel regions P2 are adjacently arranged, and a second light extraction portion CPL2 covers the two second sub-pixel regions P2 arranged adjacently and the light-transmissive region P4 between the two second sub-pixel regions P2. It will be understood that the two adjacent second sub-pixel regions P2 share the same second light extraction portion CPL2.

Similarly, it may also be that, two first sub-pixel regions P1 are adjacently arranged, and the two first sub-pixel regions P1 arranged adjacently share a same first light extraction portion CPL1; it may still be that, two third sub-pixel regions P3 are adjacently arranged, and the two third sub-pixel regions P3 arranged adjacently share a same third light extraction portion CPL3. It will not be described in detail here.

In some embodiments, as shown in FIG. 13, two sub-pixel regions displaying the same color are adjacently arranged. A cathode portion covers two sub-pixel regions displaying the same color and the light-transmissive region located between the two sub-pixel regions.

For example, as shown in FIG. 13, two second sub-pixel regions P2 are adjacently arranged. A second cathode portion CE2 covers the two second sub-pixel regions P2 arranged adjacently and the light-transmissive region P4 between the two second sub-pixel regions P2. It will be understood that the two adjacent second sub-pixel regions P2 share the same second cathode portion CE2.

Similarly, it may also be that, two first sub-pixel regions P1 are adjacently arranged, and the two first sub-pixel regions P1 arranged adjacently share the same first cathode portion CE1: it may still be that, two third sub-pixel regions P3 are adjacently arranged, and the two third sub-pixel regions P3 arranged adjacently share the same third cathode portion CE3. It will not be described in detail here.

As shown in FIG. 13, the second light extraction portion CPL2 and the second cathode portion CE2 both cover the two second sub-pixel regions P2 arranged adjacently and the light-transmissive region P4 between the two second sub-pixel regions P2. It will be understood that an orthographic projection of the second light extraction portion CPL2 on the base substrate SUB overlaps with an orthographic projection of the second cathode portion CE2 on the base substrate SUB.

It will be noted that, in a case where two sub-pixel regions share a same cathode portion and/or a same light extraction portion, at least one of the electron transport layer ETL, the electron injection layer EIL, the hole transport layer and the hole injection layer HIL may be shared by the two sub-pixel regions P.

Figure 14:
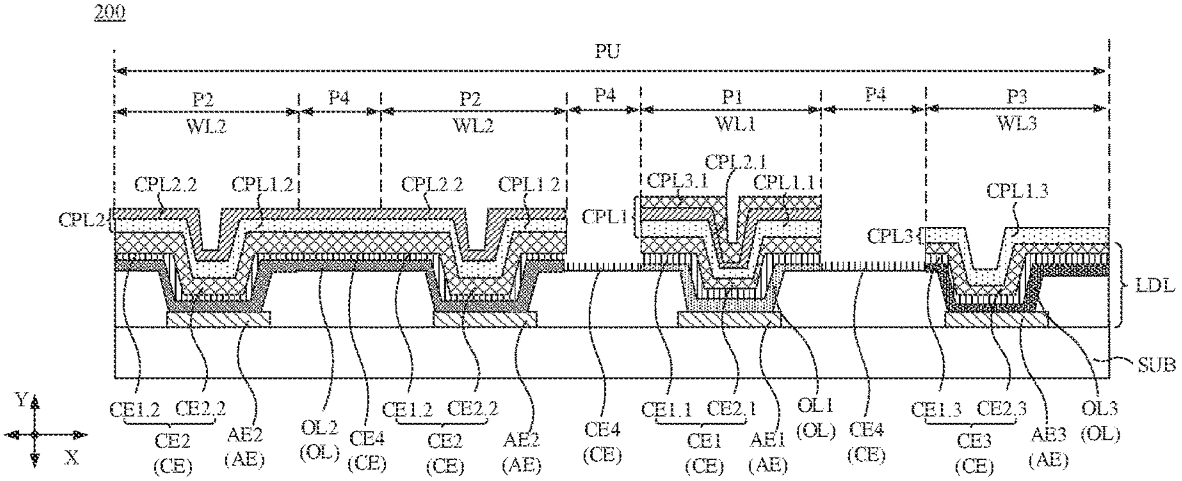
FIG. 14 is a structural diagram of a display substrate, in accordance with some embodiments.

In some embodiments, as shown in FIG. 14, two sub-pixel regions displaying the same color and the light-transmissive region P4 located between the two sub-pixel regions each have an organic layer OL and a cathode portion therein.

A material of the organic layer OL in the light-transmissive region P4 is the same as a material of the organic layers OL in the two sub-pixel regions displaying the same color. It will be understood that the organic layers located in the two sub-pixel regions displaying the same color and the organic layer in the light-transmissive region P4 are connected to each other to be of a one-piece structure.

As shown in FIG. 14, two second sub-pixel regions P2 are arranged adjacently. A second organic layer OL2 in the light-transmissive region P4 between the two second sub-pixel regions P2 that are adjacently arranged is connected to second organic layers OL2 in the two second sub-pixel regions P2 on both sides.

For example, the two second sub-pixel regions P2 arranged adjacently and the light-transmissive region P4 located between the two second sub-pixel regions P2 that are adjacently arranged may all emit green light.

Considering FIG. 14 as an example, in a process of manufacturing the display substrate, the second organic layers OL2 in the two second sub-pixel regions P2 arranged adjacently and the second organic layer OL2 located in the light-transmissive region P4 between the two second sub-pixel regions P2 that are adjacently arranged may be simultaneously manufactured by using a mask with an opening.

As shown in FIG. 14, in some examples, a fourth cathode portion CE4 in the light-transmissive region P4 between the two second sub-pixel regions P2 that are adjacently arranged is connected to second cathode portions CE2, on both sides of the fourth cathode portion CE4, in the two second sub-pixel regions P2 to form a one-piece structure.

As shown in FIG. 14, in some examples, a second light extraction portion CPL2 covering the two second sub-pixel regions P2 that are adjacently arranged covers the light-transmissive region P4 located between the two second sub-pixel regions P2 that are adjacently arranged.

Figure 15:
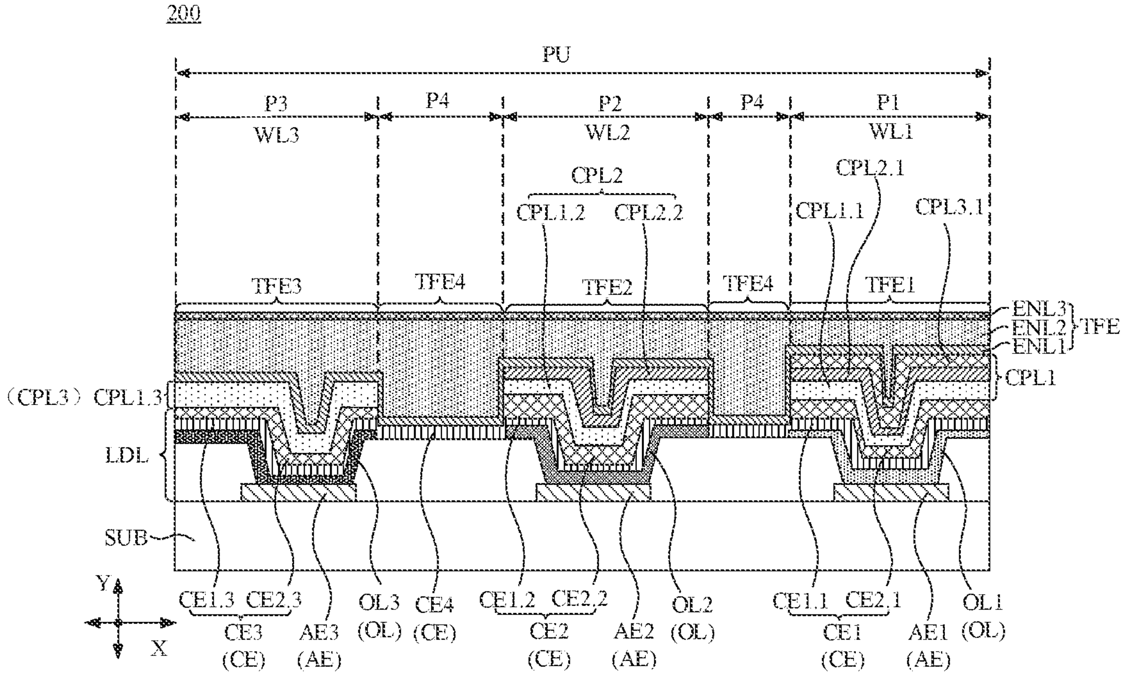
FIG. 15 is a structural diagram of a display substrate, in accordance with some embodiments.

As shown in FIGS. 7 and 15, the display substrate 200 may further include an encapsulation layer TFE for encapsulating the light-emitting device layer LDL and the light extraction layer CPL. The encapsulation layer TFE may be a continuous film covering the first sub-pixel regions P1, the second sub-pixel regions P2, the third sub-pixel regions P3 and the light-transmissive region P4.

In the pixel unit region PU, the encapsulation layer TFE may include a first encapsulation portion TFE1, a second encapsulation portion TFE2 and a third encapsulation portion TFE3. For example, the first encapsulation portion TFE1 is located in the first sub-pixel region P1, the second encapsulation portion TFE2 is located in the second sub-pixel region P2, and the third encapsulation portion TFE3 is located in the third sub-pixel region P3.

In the first sub-pixel region P1, the first encapsulation portion TFE1 may be directly located on the first light extraction portion CPL1; in the second sub-pixel region P2, the second encapsulation portion TFE2 may be directly located on the second light extraction portion CPL2; and in the third sub-pixel region P3, the third encapsulation portion TFE3 may be directly located on the third light extraction portion CPL3.

As shown in FIG. 15, in some embodiments, the encapsulation layer TFE is in direct contact with the fourth cathode portion CE4.

As shown in FIG. 15, in some embodiments, an average distance between the base substrate SUB and a surface of the first encapsulation portion TFE1 away from the base substrate SUB may be substantially equal to an average distance between the base substrate SUB and a surface of the second encapsulation portion TFE2 away from the base substrate SUB, and may be substantially equal to an average distance between the base substrate SUB and a surface of the third encapsulation portion TFE3 away from the base substrate SUB. It will be understood that a surface of the encapsulation layer TFE away from the base substrate SUB is a flat surface.

In some embodiments, as shown in FIG. 15, in the second direction Y, at least two of a dimension of the first encapsulation portion TFE1, a dimension of the second encapsulation portion TFE2 and a dimension of the third encapsulation portion TFE3 may be different.

In some examples, in the second direction Y, the dimension of the second encapsulation portion TFE2 is substantially equal to the dimension of the third encapsulation portion TFE3, and is greater than the dimension of the first encapsulation portion TFE1.

For example, in the second direction Y, the dimension of the second light extraction portion CPL2 is substantially equal to the dimension of the third light extraction portion CPL3, and is less than the dimension of the first light extraction portion CPL1; and in the second direction Y, the dimension of the second encapsulation portion TFE2 is substantially equal to the dimension of the third encapsulation portion TFE3, and is greater than the dimension of the first encapsulation portion TFE1.

In some examples, in the second direction Y, the dimension of the first encapsulation portion TFE1 is substantially equal to the dimension of the second encapsulation portion TFE2, and is less than the dimension of the third encapsulation portion TFE3.

For example, in the second direction Y, the dimension of the first light extraction portion CPL1 is substantially equal to the dimension of the second light extraction portion CPL2, and is greater than the dimension of the third light extraction portion CPL3; and in the second direction Y, the dimension of the first encapsulation portion TFE1 is substantially equal to the dimension of the second encapsulation portion TFE2, and is less than the dimension of the third encapsulation portion TFE3.

In some examples, in the second direction Y, the dimension of the first encapsulation portion TFE1 is substantially equal to the dimension of the third encapsulation portion TFE3, and is less than the dimension of the second encapsulation portion TFE2.

For example, in the second direction Y, the dimension of the first light extraction portion CPL1 is substantially equal to the dimension of the third light extraction portion CPL3, and is greater than the dimension of the second light extraction portion CPL2; and in the second direction Y, the dimension of the first encapsulation portion TFE1 is substantially equal to the dimension of the third encapsulation portion TFE3, and is less than the dimension of the second encapsulation portion TFE2.

As shown in FIG. 15, in some embodiments, in the second direction Y, a sum of the dimension of the first light extraction portion CPL1 and the dimension of the first encapsulation portion TFE1 may be substantially equal to a sum of the dimension of the second light extraction portion CPL2 and the dimension of the second encapsulation portion TFE2, and may be substantially equal to a sum of the dimension of the third light extraction portion CPL3 and the dimension of the third encapsulation portion TFE3.

In some other embodiments, the surface of the encapsulation layer TFE away from the base substrate SUB may not be a flat surface. For example, the average distance between the base substrate SUB and the surface of the first encapsulation portion TFE1 away from the base substrate SUB may be greater than the average distance between the base substrate SUB and the surface of the second encapsulation portion TFE2 away from the base substrate SUB, which is not limited thereto.

In some embodiments, in the second direction Y, the dimension of the first encapsulation portion TFE1, the dimension of the second encapsulation portion TFE2 and the dimension of the third encapsulation portion TFE3 may be different from each other.

In some examples, in the second direction Y, the dimension of the first light extraction portion CPL1 is greater than the dimension of the third light extraction portion CPL3, and the dimension of the third light extraction portion CPL3 is greater than the dimension of the second light extraction portion CPL2; and in the second direction Y, the dimension of the first encapsulation portion TFE1 is less than the dimension of the third encapsulation portion TFE3, and the dimension of the third encapsulation portion TFE3 is less than the dimension of the second encapsulation portion TFE2.

In some examples, as shown in FIG. 15, in the second direction Y, the dimension of the first light extraction portion CPL1 is greater than the dimension of the second light extraction portion CPL2, and the dimension of the second light extraction portion CPL2 is greater than the dimension of the third light extraction portion CPL3; and in the second direction Y, the dimension of the first encapsulation portion TFE1 is less than the dimension of the second encapsulation portion TFE2, and the dimension of the second encapsulation portion TFE2 is less than the dimension of the third encapsulation portion TFE3.

In some embodiments, as shown in FIG. 15, the encapsulation layer TFE further includes a fourth encapsulation portion TFE4 located in the light-transmissive region P4. In the second direction Y, a dimension of the fourth encapsulation portion TFE4 may be greater than each of the dimension of the first encapsulation portion TFE1, the dimension of the second encapsulation portion TFE2, and the dimension of the third encapsulation portion TFE3.

In some examples, an average distance between the base substrate SUB and a surface of the fourth encapsulation portion TFE4 away from the base substrate SUB may be substantially equal to each of the average distance between the base substrate SUB and the surface of the first encapsulation portion TFE1 away from the base substrate SUB, the average distance between the base substrate SUB and the surface of the second encapsulation portion TFE2 away from the base substrate SUB, and the average distance between the base substrate SUB and the surface of the third encapsulation portion TFE3 away from the base substrate SUB.

For example, in the second direction Y, a sum of the dimension of the fourth encapsulation portion TFE4 and the dimension of the fourth cathode portion CE4 may be substantially equal to a sum of the dimension of the first cathode portion CE1, the dimension of the first light extraction portion CPL1 and the dimension of the first encapsulation portion TFE1.

It has been illustrated in some of the embodiments that, in the second direction Y, the dimension of the fourth cathode portion CE4 is less than the dimension of the first cathode portion CE1. Therefore, in the second direction Y, the dimension of the fourth encapsulation portion TFE4 may be greater than the sum of the dimension of the first light extraction portion CPL1 and the dimension of the first encapsulation portion TFE1.

Similarly, in the second direction Y, the dimension of the fourth encapsulation portion TFE4 may be greater than the sum of the dimension of the second light extraction portion CPL2 and the dimension of the second encapsulation portion TFE2, and may be greater than the sum of the dimension of the third light extraction portion CPL3 and the dimension of the third encapsulation portion TFE3.

As shown in FIG. 16, in some embodiments, in the second direction Y, the dimension of the first organic layer OL1 is greater than the dimension of the second organic layer OL2, and the dimension of the second organic layer OL2 is greater than the dimension of the third organic layer OL3; and in the second direction Y, the dimension of the first encapsulation portion TFE1 is less than the dimension of the second encapsulation portion TFE2, and the dimension of the second encapsulation portion TFE2 is less than the dimension of the third encapsulation portion TFE3.

As shown in FIGS. 15 and 16, in some embodiments, the encapsulation layer TFE may include a first encapsulation layer ENL1, a second encapsulation layer ENL2 and a third encapsulation layer ENL3 that are stacked. For example, the first encapsulation layer ENL1 and the third encapsulation layer ENL3 each are made of an inorganic material. The inorganic material is selected from at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON) or lithium fluoride. As another example, the second encapsulation layer ENL2 is made of an organic material. The organic material is selected from at least one of acrylic resin, methacrylic resin, polyisoprene, vinyl resin, epoxy resin, polyurethane resin, cellulose resin or perylene resin. The number of layers, a material and structure of the encapsulation layer TFE may be varied by those skilled in the art according to requirements, which is not limited in the present disclosure.

In some examples, the first encapsulation layer ENL1 and the third encapsulation layer ENL3 each are of a thin film structure with a uniform thickness. For example, in the second direction Y, a dimension of a portion of the first encapsulation layer ENL1 in the first encapsulation portion TFE1 is substantially equal to each of a dimension of a portion of the first encapsulation layer ENL1 in the second encapsulation portion TFE2, a dimension of a portion of the first encapsulation layer ENL1 in the third encapsulation portion TFE3, and a dimension of a portion of the first encapsulation layer ENL1 in the fourth encapsulation portion TFE4. The third encapsulation layer ENL3 is similar to the first encapsulation layer ENL1 and will not be repeated here.

In some examples, in the second direction Y, the dimension of the first encapsulation portion TFE1, the dimension of the second encapsulation portion TFE2, the dimension of the third encapsulation portion TFE3 and the dimension of the fourth encapsulation portion TFE4 are different. For example, it may be that, a dimension of a portion of the second encapsulation layer ENL2 in the first encapsulation portion TFE1, a dimension of a portion of the second encapsulation layer ENL2 in the second encapsulation portion TFE2, a dimension of a portion of the second encapsulation layer ENL2 in the third encapsulation portion TFE3 and a dimension of a portion of the second encapsulation layer ENL2 in the fourth encapsulation portion TFE4 are different.

It will be understood that, in the second direction Y, the dimension of the fourth encapsulation portion TFE4 being greater than the dimension of the first encapsulation portion TFE1 may be that, in the second direction Y, the dimension of the portion of the second encapsulation layer ENL2 in the fourth encapsulation portion TFE4 is greater than the dimension of the portion of the second encapsulation layer ENL2 in the first encapsulation portion TFE1.

Figure 17:
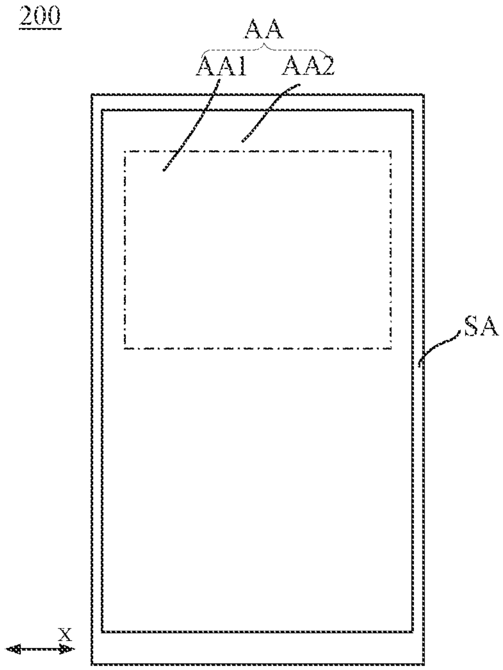
FIG. 17 is a top view of a display substrate, in accordance with some embodiments.

As shown in FIG. 17, in some embodiments, the display substrate 200 includes a light-transmissive display region AA1 and a main display region AA2 located on at least one side of the light-transmissive display region AA1. A display substrate in the light-transmissive display area AA1 is the display substrate 200 provided in any of the above embodiments.

The display area AA includes the light-transmissive display region AA1 and the main display region AA2. For example, the main display region AA2 is located on a side of the light-transmissive display region AA1. That is, the main display area AA2 is located at partial side(s) around the light-transmissive display region AA1. As another example, the main display region AA2 is located at a periphery of the light-transmissive display region AA1, the periphery including upper and lower sides and left and right sides. That is, the main display region AA2 completely surrounds the light-transmissive display region AA1.

In summary, for the display substrate provided in the embodiments of the present disclosure, by arranging the light extraction portions with different dimensions in the second direction Y, it is possible to improve the light exit efficiency of the display substrate.

Figure 18:
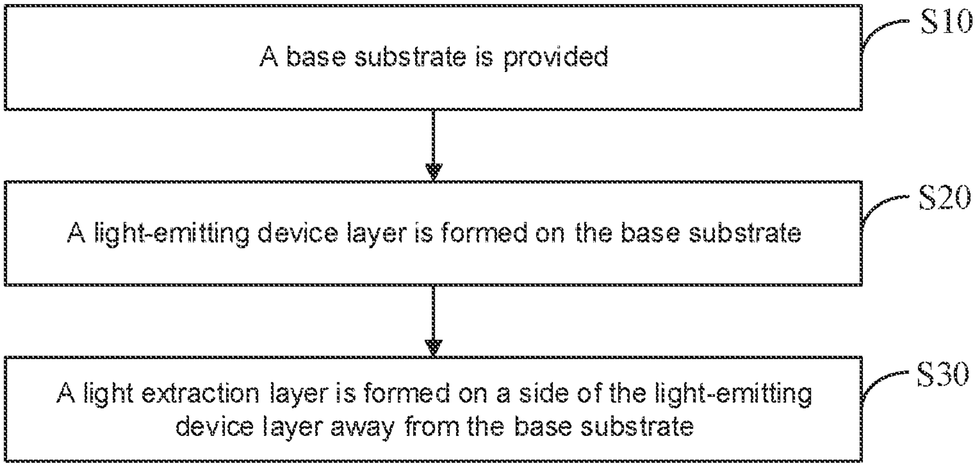
FIG. 18 is a flowchart of a method for manufacturing a display substrate, in accordance with some embodiments.

Embodiments of the present disclosure provide a method for manufacturing a display substrate. The display substrate in some of the embodiments above can be manufactured through the method. As shown in FIG. 18, the method for manufacturing the display substrate includes S10 to S30.

Figure 19A:
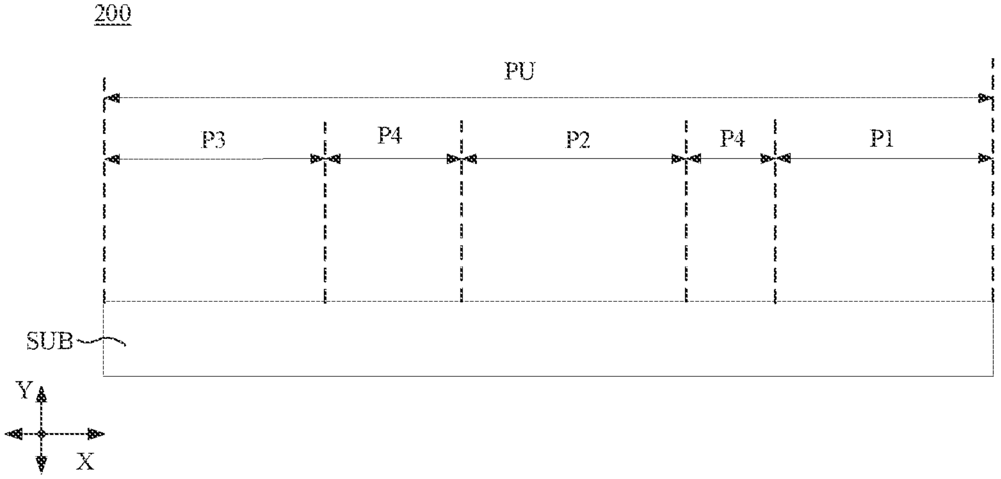
FIGS. 19A to 19M are structural diagrams of a display substrate at different steps of manufacturing, in accordance with some embodiments.

In S10, a base substrate SUB is provided. As shown in FIG. 19A, the base substrate SUB includes first sub-pixel regions P1, second sub-pixel regions P2, third sub-pixel regions P3, and a light-transmissive region P4 located between a first sub-pixel region P1, a second sub-pixel region P2 and a third sub-pixel region P3.

A material of the base substrate SUB may be, for example, polyethylene terephthalate (PET), polyimide (PI), cyclo olefin polymer (COP), etc.

The first sub-pixel region P1, the second sub-pixel region P2 and the third sub-pixel region P3 have been described above in detail, and will not be repeated here.

In S20, a light-emitting device layer LDL is formed on the base substrate SUB. As shown in FIG. 19G, the light-emitting device layer LDL includes first light-emitting devices LD1, second light-emitting devices LD2 and third light-emitting devices LD3. The first light-emitting device LD1 is located in the first sub-pixel region P1, the second light-emitting device LD2 is located in the second sub-pixel region P2, and the third light-emitting device LD3 is located in the third sub-pixel region P3.

As shown in FIG. 7, in some embodiments, a pixel circuit layer may be formed on the base substrate SUB before the light-emitting device layer LDL is formed. The pixel circuit layer includes a plurality of pixel circuits S. The pixel circuits S have been described above in detail, and will not be repeated here.

After the pixel circuits S are formed, an insulating layer INL covering the pixel circuits is formed.

In some embodiments, as shown in FIGS. 19B to 19G, forming the light-emitting device layer LDL on the insulating layer INL includes: forming an anode AE, a pixel defining layer PDL, an organic layer OL and a cathode layer CE on the insulating layer in sequence.

Figure 19B:
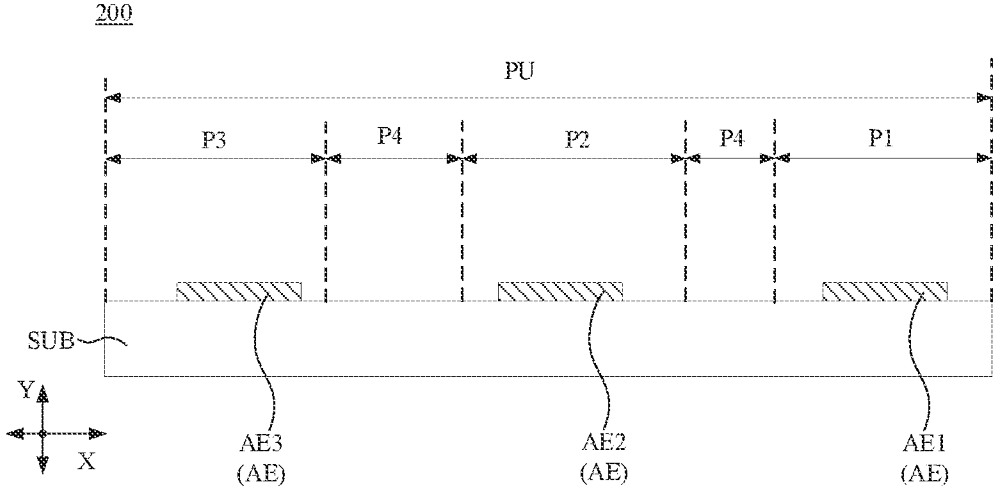

In some examples, as shown in FIG. 19B, the anode AE may be formed on the insulating layer (not shown in FIGS. 19A to 19M) through a single patterning process. The anode AE may be made of metal (such as Ag, Mg, Al, Pt, Pd, Au, Ni, Nd, Ir or Cr) or a mixture thereof, or may be made of a conductive metal oxide material such as ITO, IZO or IGZO.

The anode AE may include first anodes AE1, second anodes AE2 and third anodes AE3. The first anode AE1 is located in the first sub-pixel region P1, the second anode AE2 is located in the second sub-pixel region P2, and the third anode AE3 is located in the third sub-pixel region P3.

Figure 19C:
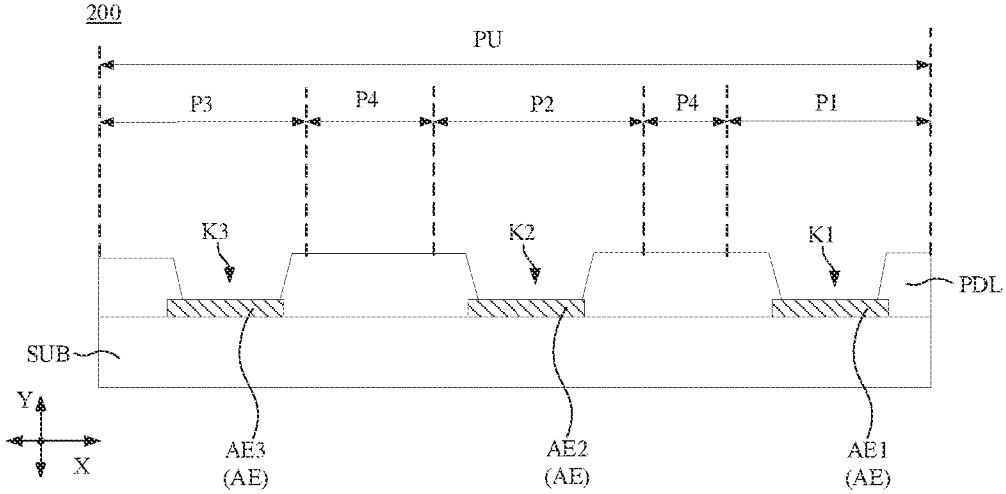

In some examples, as shown in FIG. 19C, the pixel defining layer PDL may be formed on the insulating layer and the anode AE. For example, a pixel defining material layer covering the insulating layer and the anode AE is formed by using a deposition process, and portions of pixel defining material layer are removed through an etching process to obtain the pixel defining layer PDL. The pixel defining layer PDL includes first light-emitting openings K1 located in the first sub-pixel regions P1, second light-emitting openings K2 located in the second sub-pixel regions P2, and third light-emitting openings K3 located in the third sub-pixel regions P3.

Figure 19D:
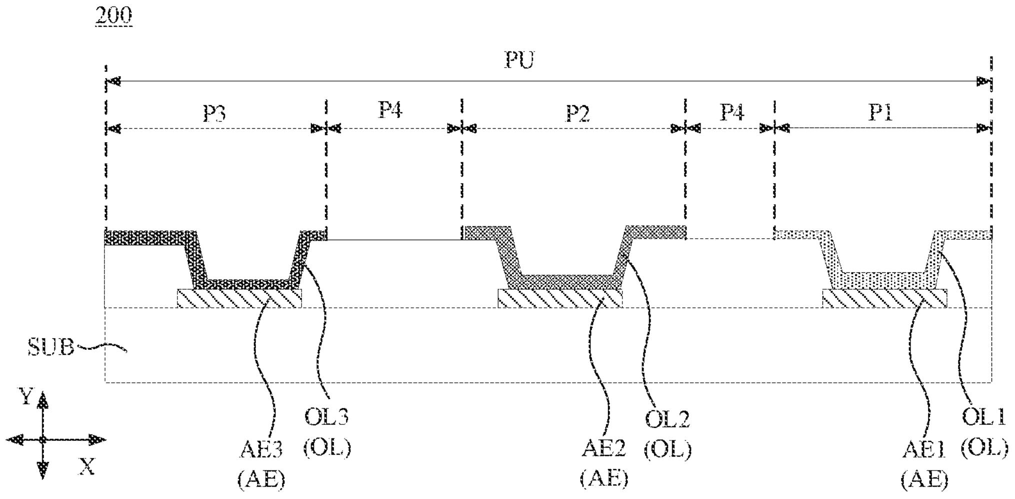

In some examples, as shown in FIG. 19D, the organic layer OL may be formed on the pixel defining layer PDL and the anode AE. The organic layer may include first organic layers OL1 located in the first sub-pixel regions P1, second organic layers OL2 located in the second sub-pixel regions P2, and third organic layers OL3 located in the third sub-pixel regions P3.

For example, light-emitting layers of a color in organic layers are formed in a process, and the process includes: forming a light-emitting material layer of the color covering the pixel defining layer PDL and the anode AE by using a deposition process, and then removing a portion of light-emitting material layer by using an etching process, so as to retain portions of the light-emitting material layer located in sub-pixel regions belonging to a same kind. For example, a red light-emitting material layer covering the pixel defining layer PDL and the anode AE is formed by using the deposition process, and then a portion of the red light-emitting material layer located in the second sub-pixel regions P2, the third sub-pixel regions P3 and the light-transmissive region P4 is removed by using the etching process, so that portions of the red light-emitting material layer in the first sub-pixel regions P1 are retained to serve as light-emitting layers in the first organic layers OL1. Manners for fabricating light-emitting layers in the second organic layers OL2 and the third organic layers OL3 are substantially the same as the manner for fabricating the light-emitting layers in the first organic layers OL1, which will not be repeated here.

The first organic layer OL1 may cover the first light-emitting opening K1, the second organic layer OL2 may cover the second light-emitting opening K2, and the third organic layer OL3 may cover the third light-emitting opening K3.

In some examples, as shown in FIG. 19G, the cathode layer CE may be formed on the pixel defining layer PDL and the organic layer OL. The cathode layer CE is located on the first sub-pixel regions P1, the second sub-pixel regions P2, the third sub-pixel regions P3 and the light-transmissive region P4. The cathode layer CE may have semi-transmissive properties or transmissive properties. In some embodiments, a material of the cathode layer CE may include Ag, Mg, Cu, Al, Pt, Pd, Au, Ni, Nd, Ir, Cr, Li, Ca, LiF/Ca, LiF/Al, Mo, Ti or a compound or mixture thereof. For example, the material of the cathode layer CE may include a mixture of Ag and Mg.

In a pixel unit region PU, the cathode layer CE may include a first cathode portion CE1, a second cathode portion CE2, a third cathode portion CE3 and a fourth cathode portion CE4 that are connected to each other. For example, the first cathode portion CE1 is located in the first sub-pixel region P1, the second cathode portion CE2 is located in the second sub-pixel region P2, the third cathode portion CE3 is located in the third sub-pixel region P3, and the fourth cathode portion CE4 is located in the light-transmissive region P4. The fourth cathode portion CE4 is connected to the first cathode portion CE1, the second cathode portion CE2 and the third cathode portion CE3 that are separated from each other.

The first anode AE1, the first organic layer OL1 and the first cathode portion CE1 that are located in the first sub-pixel region P1 constitute the first light-emitting device LD1 together; the second anode AE2, the second organic layer OL2 and the second cathode portion CE2 that are located in the second sub-pixel region P2 constitute the second light-emitting device LD2 together, and the third anode AE3, the third organic layer OL3 and the third cathode portion CE3 that are located in the third sub-pixel region P3 constitute the third light-emitting device LD3 together.

Figure 19E:
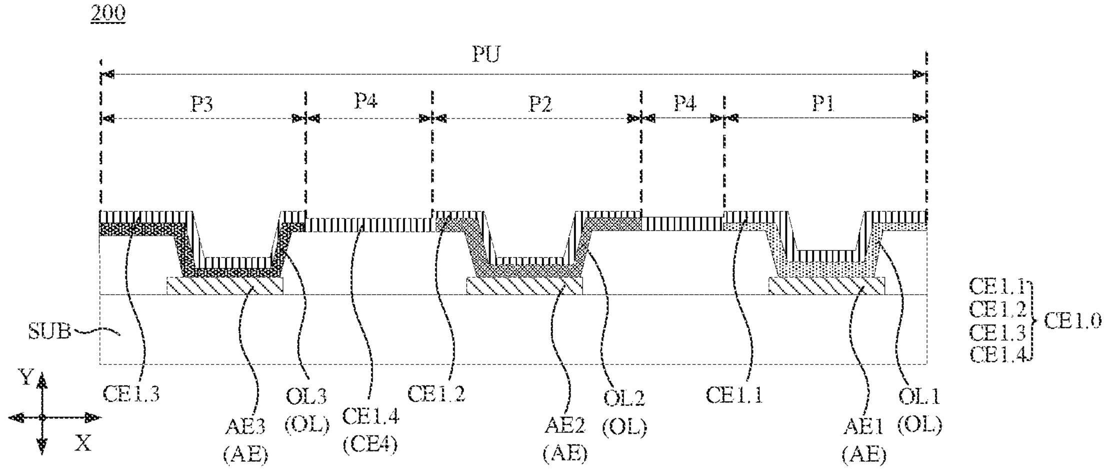

In S30, a light extraction layer CPL is formed on a side of the light-emitting device layer LDL away from the base substrate SUB. As shown in FIG. 19M, the light extraction layer CPL includes first light extraction portions CPL1, second light extraction portions CPL2 and third light extraction portions CPL3. The first light extraction portion CPL1 is located in the first sub-pixel region P1, the second light extraction portion CPL2 is located in the second sub-pixel region P2, and the third light extraction portion CPL3 is located in the third sub-pixel region P3. At least two of the first light extraction portion CPL1, the second light extraction portion CPL2 and the third light extraction portion CPL3 have different dimensions in a thickness direction of the base substrate SUB.

As shown in FIG. 19M, the light extraction layer CPL may be formed on the cathode layer CE. The light extraction layer CPL may include the first light extraction portions CPL1 located in the first sub-pixel regions P1, the second light extraction portions CPL2 located in the second sub-pixel regions P2, and the third light extraction portions CPL3 located in the third sub-pixel regions P3.

In some embodiments, S30 may include: forming a light extraction material layer covering the cathode layer CE by using an evaporation process; then exposing the light extraction material layer by using a mask with different light transmittances at different positions (e.g., a half-tone mask); and developing and etching the light extraction material layer to obtain a layer. For the layer, portions of the light extraction material layer retained in the first sub-pixel regions P1 serve as the first light extraction portions CPL1, portions of the light extraction material layer retained in the second sub-pixel regions P2 serve as the second light extraction portions CPL2, and portions of the light extraction material layer retained in the third sub-pixel regions P3 serve as the third light extraction portions CPL3.

In some examples, a position of the mask corresponding to the first sub-pixel region P1 has a different light transmittance from a position of the mask corresponding to the second sub-pixel region P2. In this way, in the second direction Y, a dimension of the first light extraction portion CPL1 finally formed in the first sub-pixel region P1 is different from a dimension of the second light extraction portion CPL2 finally formed in the second sub-pixel region P2.

Figure 20:
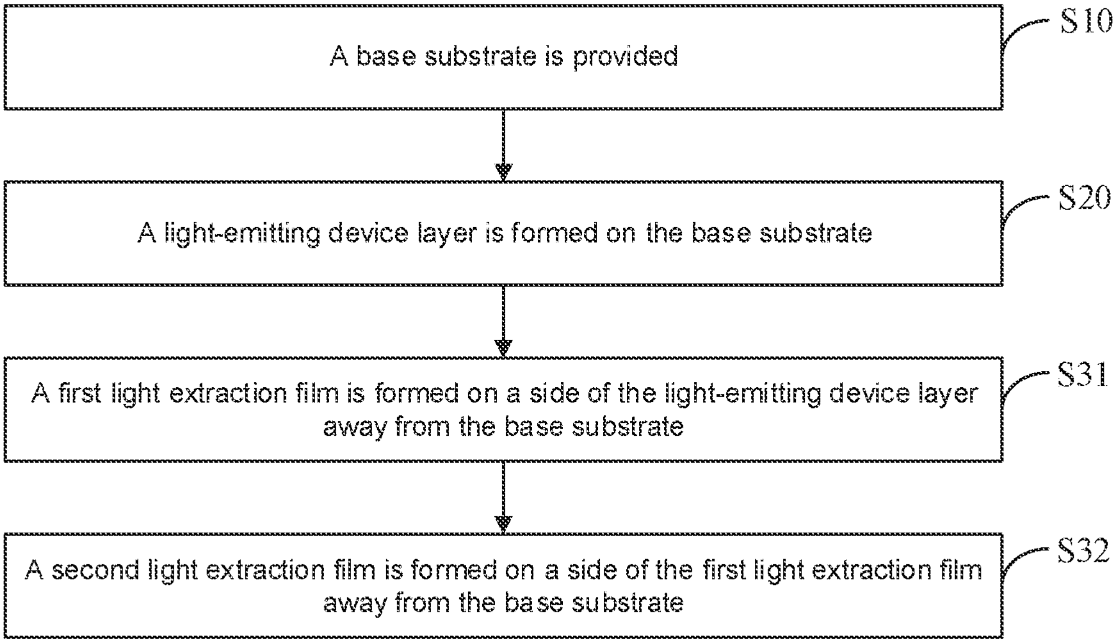
FIG. 20 is a flowchart of a method for manufacturing a display substrate, in accordance with some embodiments.

In some embodiments, as shown in FIG. 20, S30 may include S31 and S32.

In S31, a first light extraction film CPL1.0 is formed on the side of the light-emitting device layer LDL away from the base substrate SUB. As shown in FIG. 19H, the first light extraction film CPL1.0 is located in the first sub-pixel regions P1, the second sub-pixel regions P2 and the third sub-pixel regions P3.

For example, a first light extraction material layer covering the cathode layer CE is formed by using the evaporation process, and then a portion of the first light extraction material layer in the light-transmissive region P4 is removed by using the etching process, so that portions of the first light extraction material layer located in the sub-pixel regions are retained to form the first light extraction film CPL1.0.

In S32, a second light extraction film CPL2.0 is formed on a side of the first light extraction film CPL1.0 away from the base substrate. As shown in FIG. 19J, the second light extraction film CPL2.0 covers one or two kinds of the first sub-pixel regions P1, the second sub-pixel regions P2 and the third sub-pixel regions P3.

For example, a second light extraction material layer covering the cathode layer CE and the first light extraction film CPL1.0 is formed by using the evaporation process, and then a portion of the second light extraction material layer in the light-transmissive region P4 and at least one sub-pixel region is removed by using the etching process, so that a portion of the second light extraction material layer in at least one sub-pixel region is retained. As a result, at least two light extraction portions with different dimensions in the thickness direction of the base substrate are formed.

For example, after the second light extraction material layer covering the cathode layer CE and the first light extraction film CPL1.0 is formed, a portion of the second light extraction material layer in the light-transmissive region P4 and the third sub-pixel regions P3 is removed by using the etching process, and portions of the second light extraction material layer in the first sub-pixel regions P1 and the second sub-pixel regions P2 are retained to form the second light extraction film CPL2.0. Thus, in the first sub-pixel region P1, a portion of the first light extraction film CPL1.1 and a portion of the second light extraction film CPL2.1 serve as the first light extraction portion CPL1; in the second sub-pixel region P2, a portion of the first light extraction film CPL1.2 and a portion of the second light extraction film CPL2.2 serve as the second light extraction portion CPL2; and in the third sub-pixel region P3, a portion of the first light extraction film CPL1.3 serves as the third light extraction portion CPL3.

Therefore, in the second direction Y, the dimension of the first light extraction portion CPL1 is substantially equal to the dimension of the second light extraction portion CPL2, and is greater than the dimension of the third light extraction portion CPL3.

As another example, after the second light extraction material layer covering the cathode layer CE and the first light extraction film CPL1.0 is formed, a portion of the second light extraction material layer in the light-transmissive region P4, the second sub-pixel regions P2 and the third sub-pixel regions P3 is removed by using the etching process, and portions of the second light extraction material layer in the first sub-pixel regions P1 are retained to form the second light extraction film CPL2.0. Thus, in the first sub-pixel region P1, a portion of the first light extraction film and a portion of the second light extraction film serve as the first light extraction portion CPL1; in the second sub-pixel region P2, a portion of the first light extraction film serves as the second light extraction portion CPL2; and in the third sub-pixel region P3, a portion of the first light extraction film serves as the third light extraction portion CPL3.

Therefore, in the second direction Y, the dimension of the second light extraction portion CPL2 is substantially equal to the dimension of the third light extraction portion CPL3, and is less than the dimension of the first light extraction portion CPL1.

It will be noted that, a material of the first light extraction material layer and a material of the second light extraction material layer may be the same material or two materials having similar properties, which will not be limited here.

In summary, in combination with a case where light extraction portions corresponding to light of different colors at respective optimum light exit efficiencies have different dimensions in the second direction Y, for the display substrate provided in the embodiments of the present disclosure, dimensions, in the second direction Y, of light extraction portions in different sub-pixel regions can be adaptively adjusted, so that the light exit efficiencies in the sub-pixel regions are improved. As a result, the light exit efficiency of the display substrate 200 can be improved.

Figure 21:
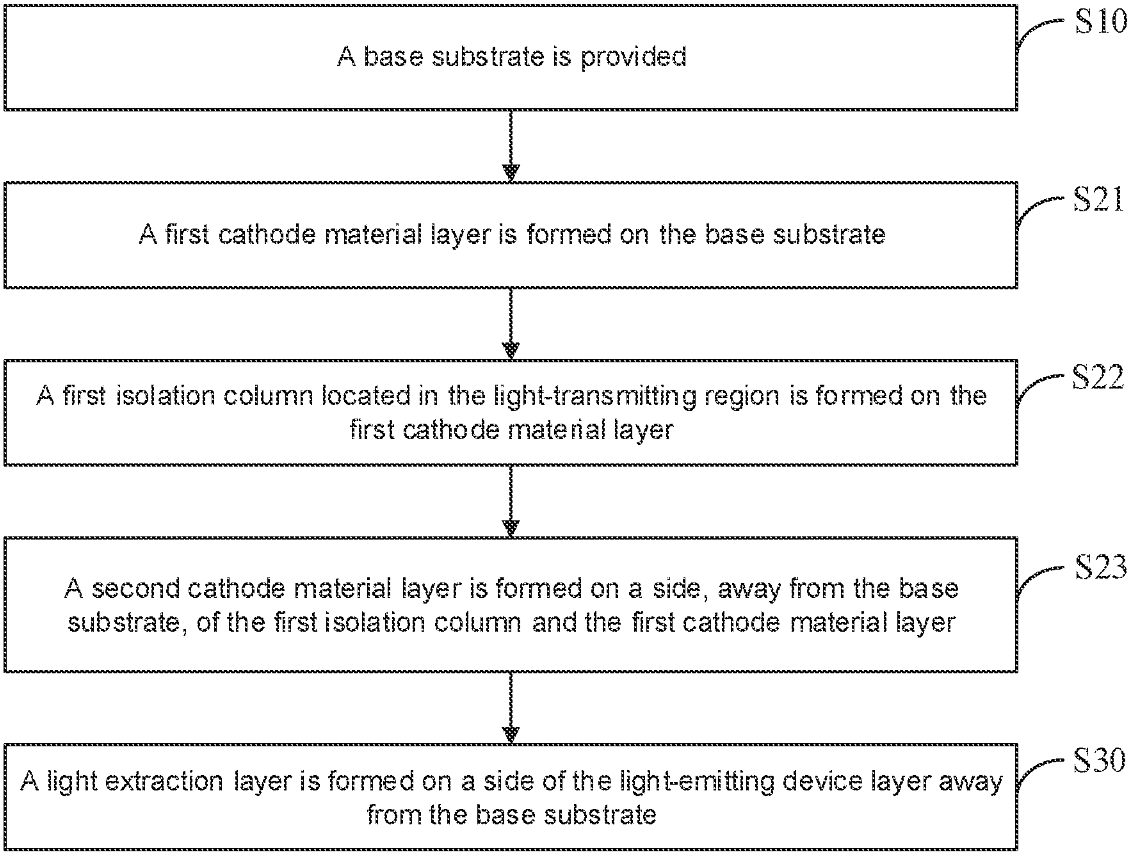
FIG. 21 is a flowchart of a method for manufacturing a display substrate, in accordance with some embodiments.

As shown in FIG. 21, in some embodiments, S20 may include S21 to S23.

In S21, a first cathode material layer CE1.0 is formed on the base substrate SUB. As shown in FIG. 19E, the first cathode material layer CE1.0 covers the first sub-pixel regions P1, the second sub-pixel regions P2, the third sub-pixel regions P3 and the light-transmissive region P4.

For example, the first cathode material layer CE1.0 may be formed by using the deposition process. The first cathode material layer CE1.0 may be of a layer structure with a uniform film thickness. A dimension of the first cathode material layer CE1.0 in the second direction Y may be in a range of 50 Å to 100 Å, such as 50 Å, 55 Å, 60 Å, 65 Å, 70 Å, 75 Å, 80 Å, 85 Å, 90 Å, 95 Å or 100 Å.

Before S21, S20 may further include steps of forming the anode AE and the organic layer OL, which has been described above in detail and will not be repeated here.

Figure 19F:
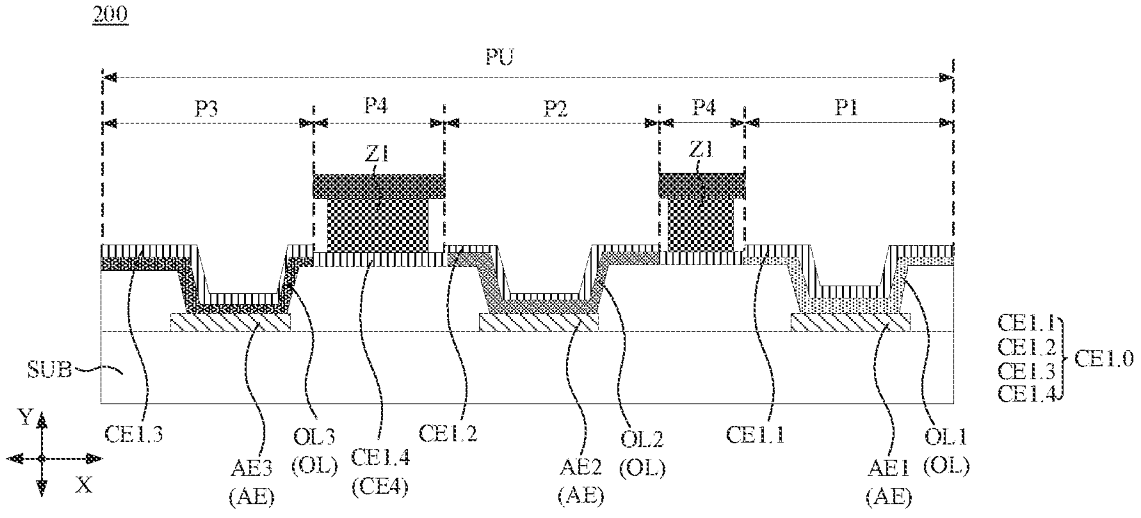
Figure 19G:
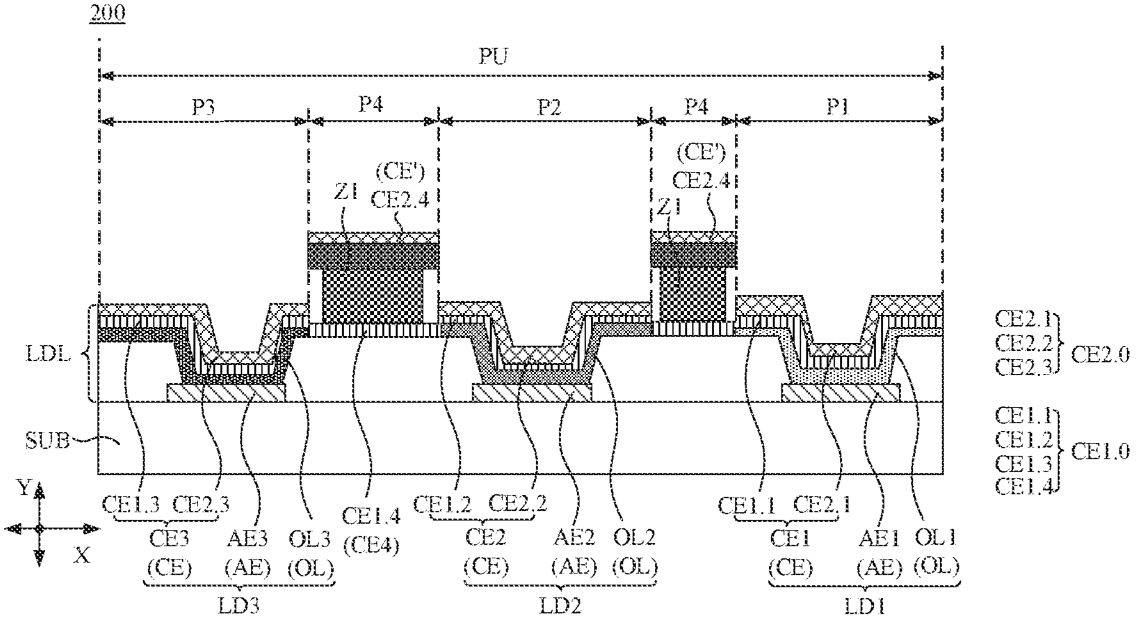
Figure 19H:
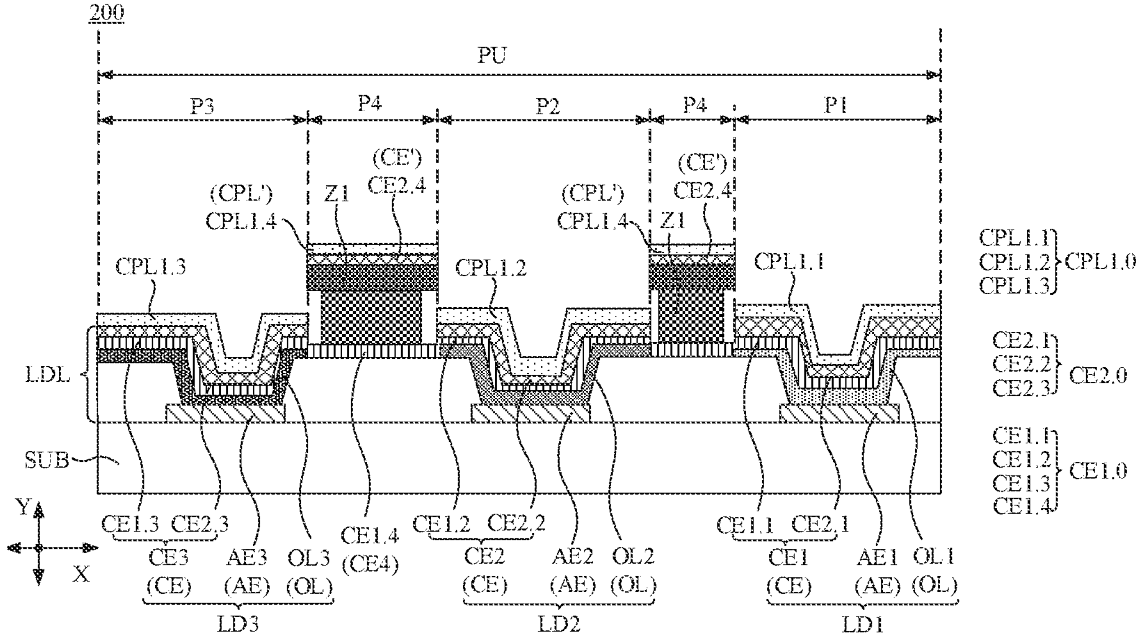

In S22, as shown in FIG. 19F, a first isolation column Z1 located in the light-transmissive region P4 is formed on the first cathode material layer CE1.0.

An end of the first isolation column Z1 away from the base substrate SUB is larger than an end of the first isolation column Z1 proximate to the base substrate SUB. For example, a section of the first isolation column Z1 taken along the thickness direction of the base substrate SUB may be in a shape of a trapezoid. A long base of the trapezoid is far away from the base substrate SUB, and a short base of the trapezoid is close to the base substrate SUB. As another example, as shown in FIG. 19F, the section of the first isolation column Z1 may be in a "T" shape.

In some examples, forming the first isolation column Z1 may include following steps. A first isolation material layer covering the first cathode material layer CE1.0 is formed by using the deposition process; next, portions of the first isolation material layer in the first sub-pixel regions P1, the second sub-pixel regions P2 and the third sub-pixel regions P3 are removed by using the etching process, and thus a portion of the first isolation material layer in the light-transmissive region P4 is retained; then, a second isolation material layer covering the first cathode material layer CE1.0 and the retained portion of the first isolation material layer is formed by using the deposition process; thereafter, portions of the second isolation material layer in the first sub-pixel regions P1, the second sub-pixel regions P2 and the third sub-pixel regions P3 are removed by using the etching process, and thus a portion of the second isolation material layer in the light-transmissive region P4 is retained (in this case, the portion of the first isolation material layer and the portion of second isolation material layer that are stacked are formed in the light-transmissive region P4); and finally, the portion of the first isolation material layer in the light-transmissive region P4 is partially etched by using a wet etching process to reduce a dimension of the portion of the first isolation material layer in the first direction X, so that the first isolation column Z1 is formed.

It will be noted that, the above description is merely exemplary and does not limit other manners of forming the first isolation column Z1.

In S23, a second cathode material layer is formed on a side, away from the base substrate SUB, of the first isolation column Z1 and the first cathode material layer CE1.0. As shown in FIG. 19G, the second cathode material layer includes a cathode film CE2.0 and a cathode sacrificial layer CE'. The cathode film CE2.0 covers the first sub-pixel regions P1, the second sub-pixel regions P2 and the third sub-pixel regions P3; the cathode sacrificial layer CE' covers the first isolation column Z1. The first isolation column Z1 separates portions of the second cathode material layer in two adjacent sub-pixel regions.

For example, the second cathode material layer may be formed by using the deposition process. The second cathode material layer may be of a layer structure with a uniform film thickness. A dimension of the second cathode material layer in the second direction Y may be in a range of 10 Å to 100 Å, such as 10 Å, 20 Å, 30 Å, 40 Å, 50 Å, 60 Å, 70 Å, 80 Å, 90 Å or 100 Å.

In some examples, the second cathode material layer covers the first sub-pixel regions P1, the second sub-pixel regions P2, the third sub-pixel regions P3 and the light-transmissive region P4. Portions CE2.1 of the second cathode material layer in the first sub-pixel regions P1, portions CE2.2 of the second cathode material layer in the second sub-pixel regions P2 and portions CE2.3 of the second cathode material layer in the third sub-pixel regions P3 together constitute the cathode film CE2.0. A portion CE2.4 of the second cathode material layer in the light-transmissive region P4 is the cathode sacrificial layer CE', and the cathode sacrificial layer CE' is located on the first isolation column Z1.

As shown in FIG. 19G, the first isolation column Z1 separates the cathode sacrificial layer CE' from the cathode film CE2.0, and the light-transmissive region P4 is located between two adjacent sub-pixel regions. Therefore, the first isolation column Z1 separates portions of the second cathode material layer in the sub-pixel regions.

A portion CE1.1 of the first cathode material layer and a portion CE2.1 of the second cathode material layer that are located in the first sub-pixel region P1 together constitute the first cathode portion CE1; a portion CE1.2 of the first cathode material layer and a portion CE2.2 of the second cathode material layer that are located in the second sub-pixel region P2 together constitute the second cathode portion CE2; and a portion CE1.3 of the first cathode material layer and a portion CE2.3 of the second cathode material layer that are located in the third sub-pixel region P3 together constitute the third cathode portion CE3.

As shown in FIG. 19M, the first isolation column Z1 may be stripped from the base substrate SUB subsequently to remove the cathode sacrificial layer CE' in the light-transmissive region P4, so as to reduce a thickness of a portion of the cathode layer in the light-transmissive region P4. Thus, a portion CE1. 4 of the first cathode material layer in the light-transmissive region P4 serves as the fourth cathode portion CE4.

In the embodiments, dimensions, in the second direction Y, of cathode portions in the sub-pixel regions are increased by the first isolation column Z1, which can improve light exit efficiencies of light-emitting devices of different colors in the sub-pixel regions. In addition, in the second direction Y, a dimension of the fourth cathode portion CE4 in the light-transmissive region P4 is less than a dimension of a cathode portion in a sub-pixel region (e.g., the first cathode portion CE1 in the first sub-pixel region P1), which can increase a light transmittance of the light-transmissive region P4, thereby improving the light-transmissive performance of the display substrate 200.

Figure 22:
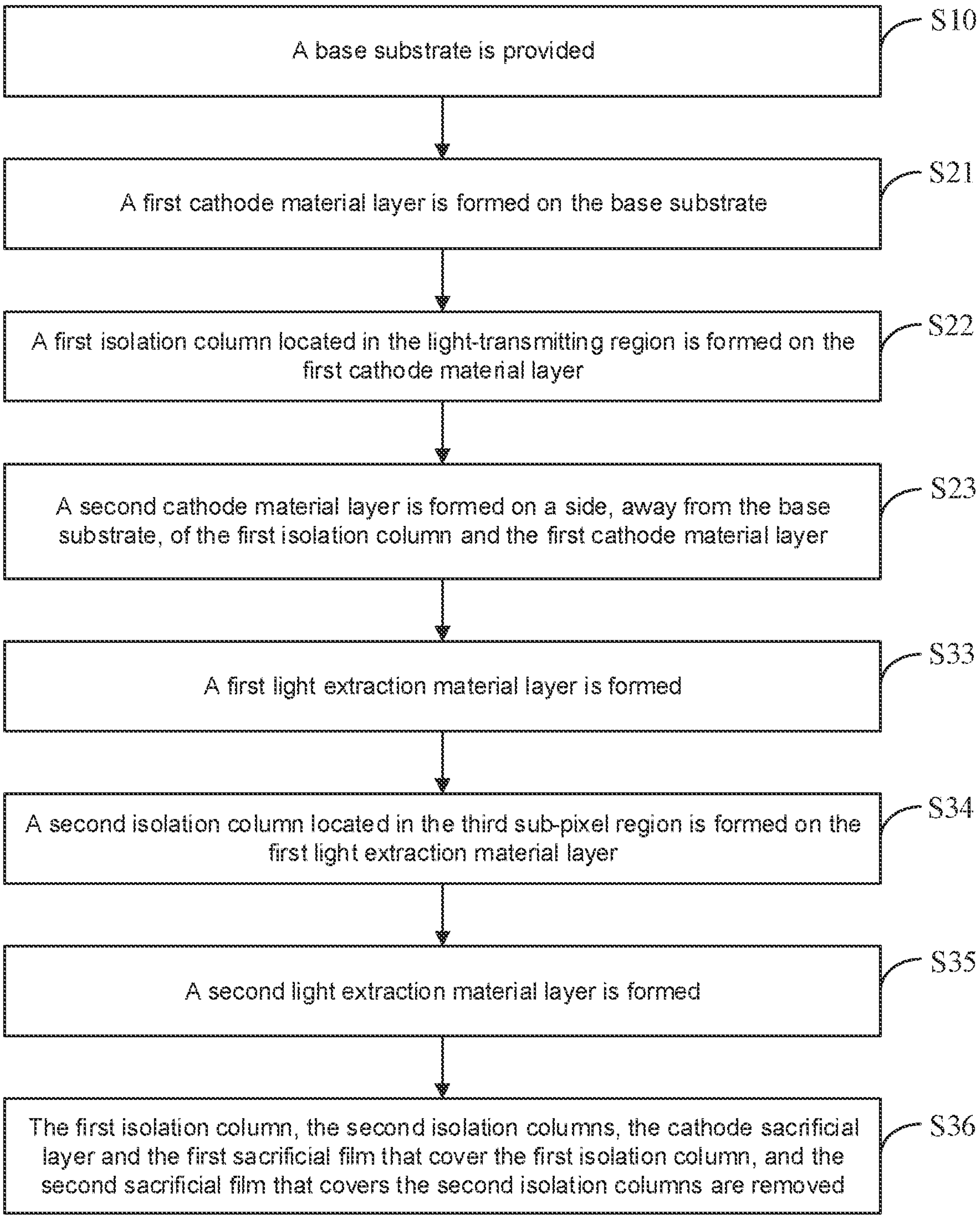
FIG. 22 is a flowchart of a method for manufacturing a display substrate, in accordance with some embodiments.

In some embodiments, as shown in FIG. 22, S30 may include S33 to S36.

In S33, the first light extraction material layer is formed. As shown in FIG. 19H, the first light extraction material layer includes the first light extraction film CPL1.0 and a first sacrificial film CPL'. The first light extraction film CPL1.0 is located in the first sub-pixel regions P1, the second sub-pixel regions P2 and the third sub-pixel regions P3; the first sacrificial film CPL' covers the cathode sacrificial layer CE'. The first isolation column Z1 separates the first light extraction film CPL1.0 and the first sacrificial film CPL'.

As shown in FIG. 19H, after the second cathode material layer is formed in S23, the first light extraction material layer may be formed on the second cathode material layer by using the evaporation process. The first light extraction material layer covers the first sub-pixel regions P1, the second sub-pixel regions P2, the third sub-pixel regions P3 and the light-transmissive region P4. Portions CPL1.1 of the first light extraction material layer located in the first sub-pixel regions P1, portions CPL1.2 of the first light extraction material layer located in the second sub-pixel regions P2 and portions CPL1.3 of the first light extraction material layer located in the third sub-pixel regions P3 together constitute the first light extraction film CPL1.0. A portion CPL1.4 of the first light extraction material layer located in the light-transmissive region P4 is the first sacrificial film CPL', and the first sacrificial film CPL' is located on the cathode sacrificial layer CE'.

As shown in FIG. 19H, the first isolation column Z1 separates the first sacrificial film CPL' from the first light extraction film CPL1.0, and the light-transmissive region P4 is located between two adjacent sub-pixel regions. Therefore, the first isolation column Z1 separates portions of the first light extraction film in the sub-pixel regions.

The first isolation column Z1 may be stripped from the base substrate SUB subsequently, thereby removing the cathode sacrificial layer CE2.4 and the first sacrificial film CPL' in the light-transmissive region P4 together.

Figure 19I:
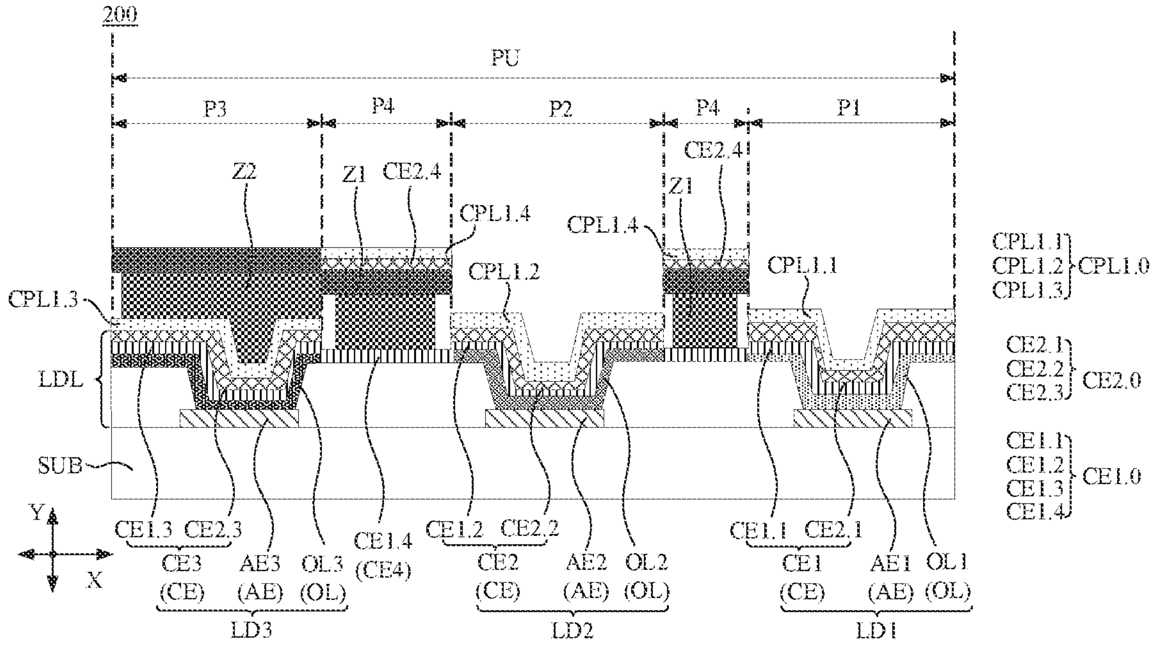
Figure 19J:
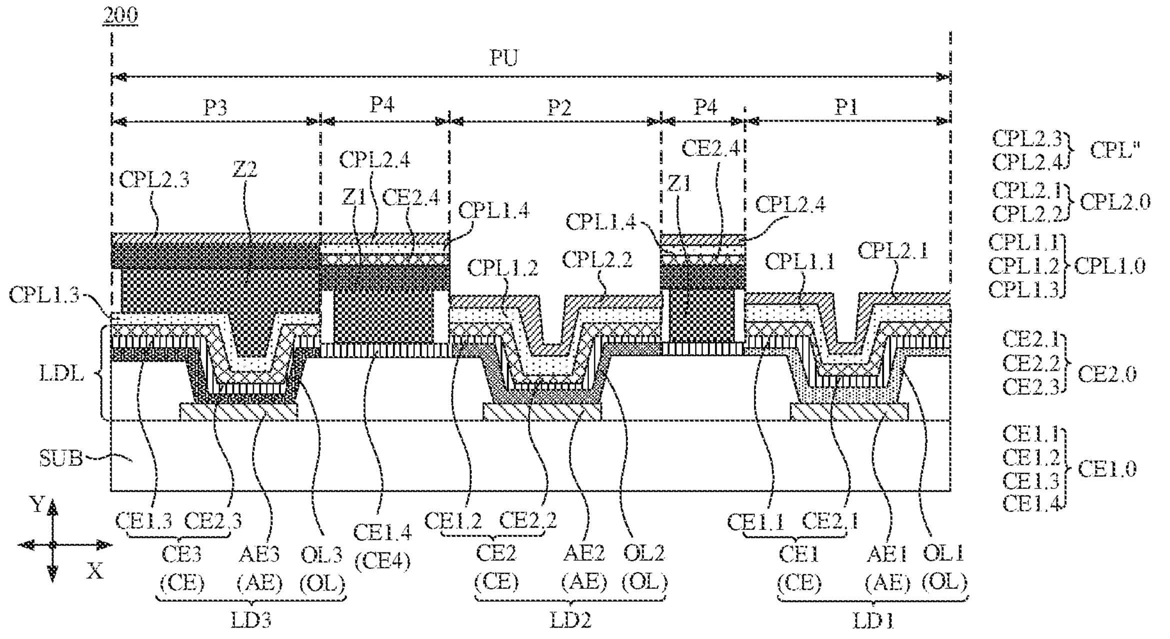

In S34, as shown in FIG. 19I, second isolation columns Z2 located in the third sub-pixel regions P3 are formed on the first light extraction material layer.

The second isolation column Z2 and the first isolation column Z1 have substantially the same structural feature and formation manner, and relevant contents of the first isolation column Z1 have been described above in detail, and the structural feature and formation manner of the second isolation column Z2 will not be repeated here.

As shown in FIG. 19I, in some examples, a surface of the second isolation column Z2 away from the base substrate SUB and a surface of the first sacrificial film CPL' away from the base substrate SUB form a continuous surface.

In S35, the second light extraction material layer is formed. As shown in FIG. 19J, the second light extraction material layer includes the second light extraction film CPL2.0 and a second sacrificial film CPL". The second light extraction film CPL2.0 is located in the first sub-pixel regions P1 and the second sub-pixel regions P2, and the second sacrificial film CPL" covers the first sacrificial film CPL' and the second isolation columns Z2. The second isolation columns Z2 separate the second light extraction film CPL2.0 and the second sacrificial film CPL".

As shown in FIG. 19J, the second light extraction material layer may be formed on the first light extraction material layer by using the evaporation process. The second light extraction material layer covers the first sub-pixel regions P1, the second sub-pixel regions P2, the third sub-pixel regions P3 and the light-transmissive region P4. Portions CPL2.1 of the second light extraction material layer located in the first sub-pixel regions P1 and portions CPL2.2 of the second light extraction material layer located in the second sub-pixel regions P2 together constitute the second light extraction film CPL2.0. Portions CPL2.3 of the second light extraction material layer located in the third sub-pixel regions P3 and a portion CPL2.4 of the second light extraction material layer located in the light-transmissive region P4 together constitute the second sacrificial film CPL". The portion CPL2.4 of the second light extraction material layer located in the light-transmissive region P4 is located on the first sacrificial film CPL', and the portions CPL2.3 of the second light extraction material layer located in the third sub-pixel regions P3 are located on the second isolation columns Z2.

As shown in FIG. 19J, the second isolation columns Z2 and the first isolation column Z1 together separate the second sacrificial film CPL" from the second light extraction film CPL2.0, and the light-transmissive region P4 is located between the first sub-pixel region P1 and the second sub-pixel region P2. Therefore, the first isolation column Z1 further separates a portion of the second light extraction film in the first sub-pixel region P1 from a portion of the second light extraction film in the second sub-pixel region P2.

In S36, the first isolation column Z1, the second isolation columns Z2, the cathode sacrificial layer CE' and the first sacrificial film CPL' that cover the first isolation column Z1', and the second sacrificial film CPL" that covers the second isolation columns Z2 are removed, so that the first light extraction portions CPL1 located in the first sub-pixel regions P1, the second light extraction portions CPL2 located in the second sub-pixel regions P2 and the third light extraction portion CPL3 located in the third sub-pixel regions P3 are formed.

A portion CPL1.1 of the first light extraction material layer and a portion CPL2.1 of the second light extraction material layer that are retained in the first sub-pixel region P1 together constitute the first light extraction portion CPL1; a portion CPL1.2 of the first light extraction material layer and a portion CPL2.2 of the second light extraction material layer that are retained in the second sub-pixel region P2 together constitute the second light extraction portion CPL2; and a portion CPL1.3 of the first light extraction material layer retained in the third sub-pixel region P3 serves as the third light extraction portion CPL3.

In the second direction Y, the dimension of the third light extraction portion CPL3 is a dimension of the first light extraction film. In the second direction Y, the dimension of the second light extraction portion CPL2 and the dimension of the first light extraction portion CPL1 are approximately equal, and are both a sum of a dimension of the first light extraction film and a dimension of the second light extraction film.

In some examples, a thickness of a portion of the light extraction layer CPL corresponding to the optimum light exit efficiency of the first light-emitting device LD1 is 900 Å, a thickness of a portion of the light extraction layer CPL corresponding to the optimum light exit efficiency of the second light-emitting device LD2 is 650 Å, and a thickness of a portion of the light extraction layer CPL corresponding to the optimum light exit efficiency of the third light-emitting device LD3 is 550 Å.

For example, in the second direction Y, the dimension of the first light extraction film is 550 Å, and the dimension of the second light extraction film is 100 Å. Thus, a thickness of the third light extraction portion CPL3 is 550 Å, and the light exit efficiency in the third sub-pixel region P3 is optimal; and a thickness of the second light extraction portion CPL2 is 650 Å, and the light exit efficiency in the second sub-pixel region P2 is optimal.

As another example, in the second direction Y, the dimension of the first light extraction film is 550 Å, and the dimension of the second light extraction film is 350 Å. Thus, the thickness of the third light extraction portion CPL3 is 550 Å, and the light exit efficiency in the third sub-pixel region P3 is optimal; and a thickness of the first light extraction portion CPL1 is 900 Å, and the light exit efficiency in the first sub-pixel region P1 is optimal.

In the embodiments, the first isolation column Z1 and the second isolation columns Z2 may be removed together, and the cathode sacrificial layer CE' and the first sacrificial film CPL' that cover the first isolation column Z1, and the second sacrificial film CPL" that covers the second isolation columns Z2 are removed together in the process of removing the first isolation column Z1 and the second isolation columns Z2.

The inventors of the present disclosure have found through research that, the less the number of times an isolation column is stripped from the cathode layer CE, the better the light output performance of the display substrate 200. In the embodiments, by removing the first isolation column Z1 and the second isolation columns Z2 together, it is possible to reduce the number of times the isolation columns are stripped from the cathode layer CE, thereby improving the light output performance of the display substrate.

In the embodiments, light extraction portions with different dimensions in the second direction Y can be formed on the display substrate 200, and dimensions, in the second direction Y, of light extraction portions in different sub-pixel regions can be adaptively adjusted, so that the light exit efficiencies in the sub-pixel regions are improved. As a result, the light exit efficiency of the display substrate 200 can be improved.

Figure 23:
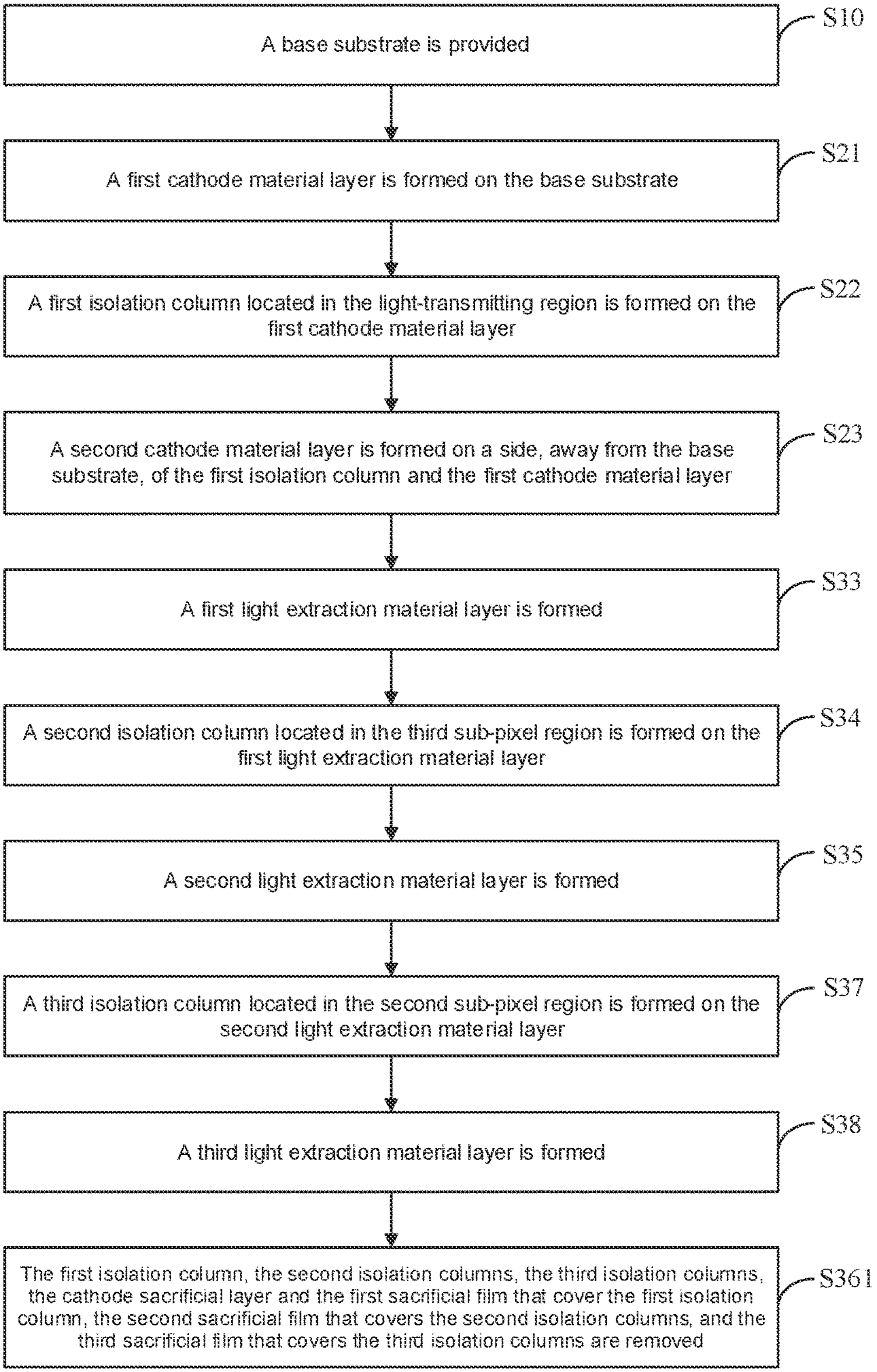
FIG. 23 is a flowchart of a method for manufacturing a display substrate, in accordance with some embodiments.

In some embodiments, as shown in FIG. 23, S37 and S38 may further be included after S35.

Figure 19K:
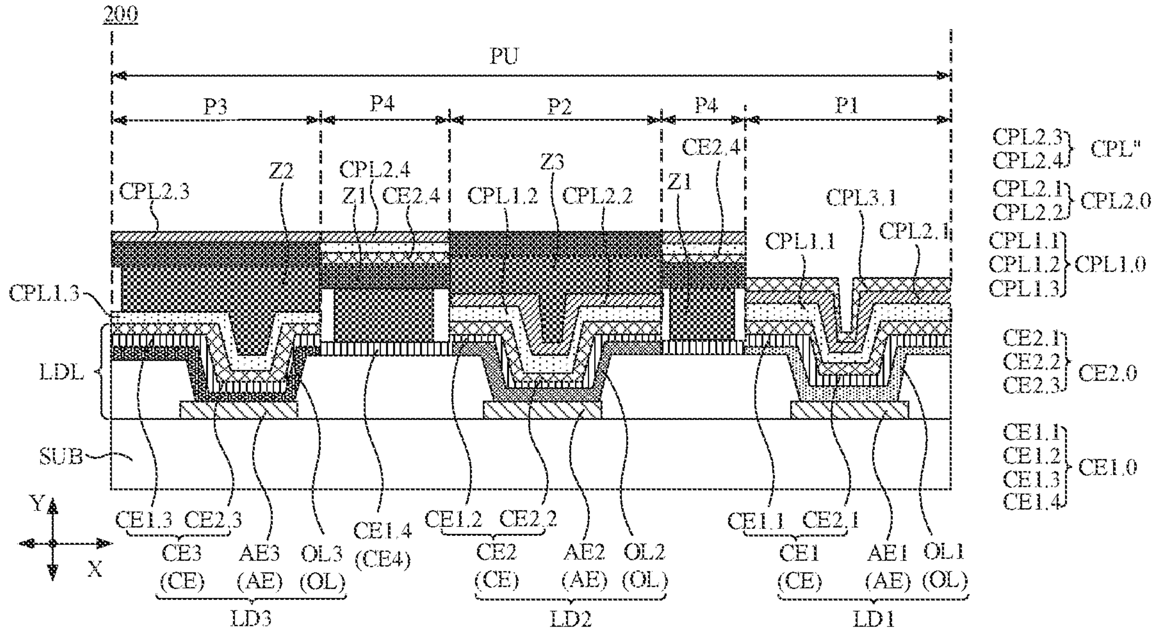

In S37, as shown in FIG. 19K, third isolation columns Z3 located in the second sub-pixel regions P2 are formed on the second light extraction material layer.

The third isolation column Z3 and the first isolation column Z1 have substantially the same structural feature and formation manner, and relevant contents of the first isolation column Z1 have been described in detail previously, and the structural feature and formation manner of the third isolation column Z3 will not be repeated here.

The third isolation column Z3 may be located directly on the portion CPL2.2 of the second light extraction material layer in the second sub-pixel region P2. In some examples, a surface of the third isolation column Z3 away from the base substrate SUB and a surface of the second sacrificial film CPL" away from the base substrate SUB form a continuous surface.

Figure 19L:
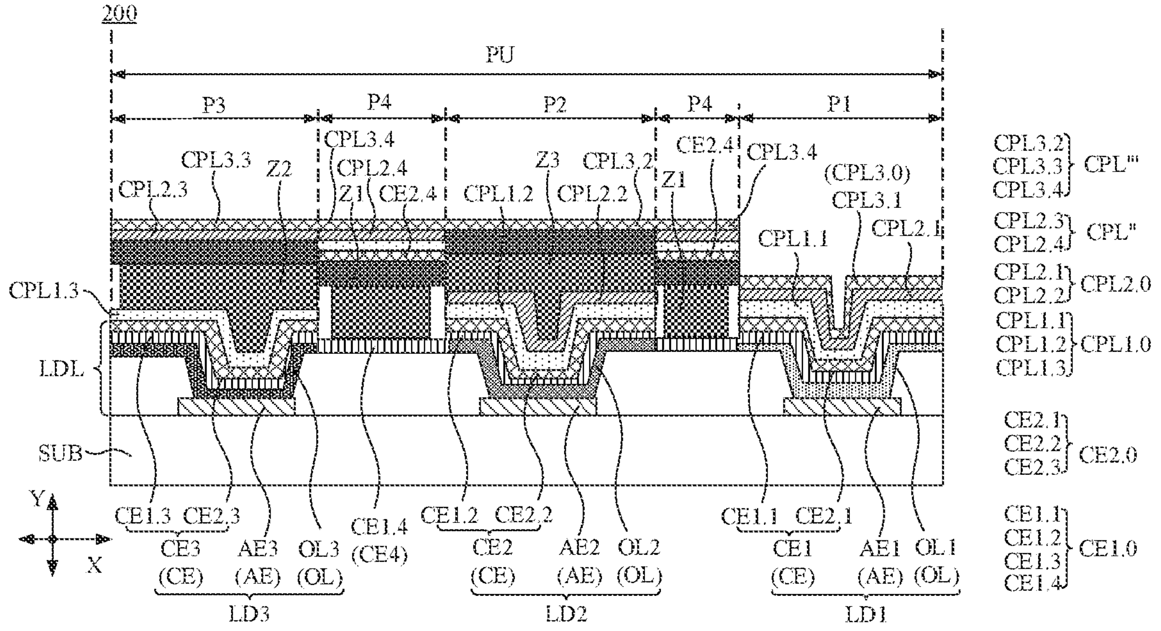
Figure 19M:
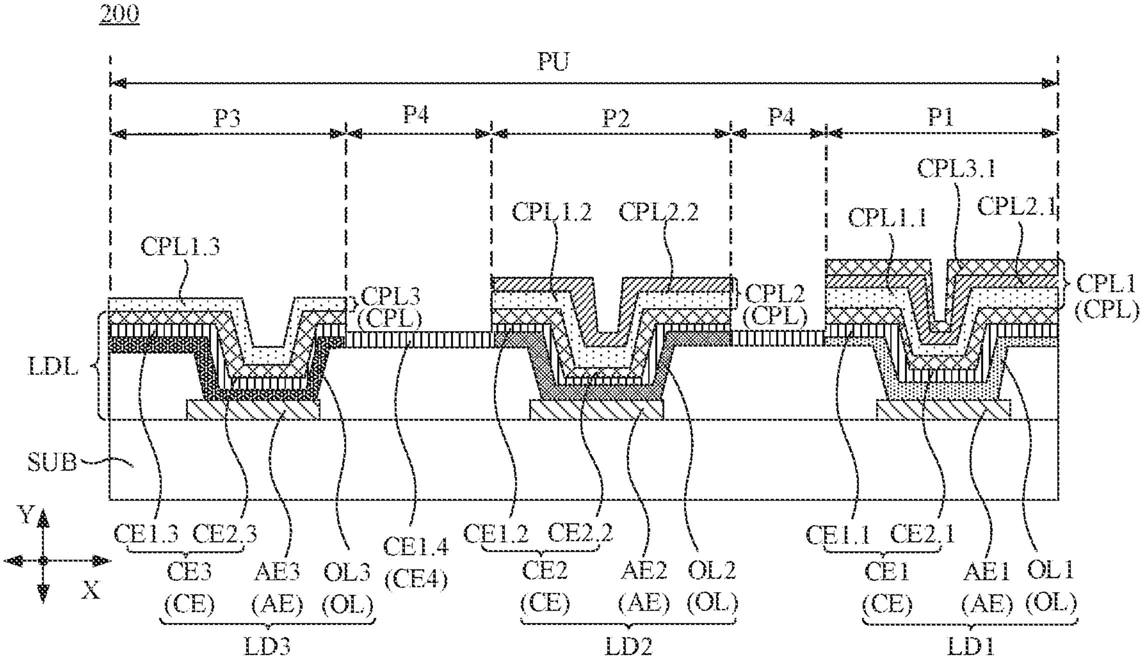

In S38, a third light extraction material layer is formed. As shown in FIG. 19L, the third light extraction material layer includes a third light extraction film CPL3.0 and a third sacrificial film CPL". The third light extraction film CPL3.0 is located in the first sub-pixel regions P3, and the third sacrificial film CPL"' covers the second sacrificial film CPL" and the third isolation columns Z3. The third isolation columns Z3 separate the third light extraction film CPL3.0 and the third sacrificial film CPL"'.

As shown in FIG. 19L, the third light extraction material layer may be formed on the second light extraction material layer by using the evaporation process. The third light extraction material layer covers the first sub-pixel regions P1, the second sub-pixel regions P2, the third sub-pixel regions P3 and the light-transmissive region P4. Portions CPL3.1 of the third light extraction material layer located in the first sub-pixel regions P1 form the third light extraction film CPL3.0. Portions CPL3.2 of the third light extraction material layer located in the second sub-pixel regions P2, portions CPL3.3 of the third light extraction material layer located in the third sub-pixel regions P3 and a portion CPL3.4 of the third light extraction material layer located in the light-transmissive region P4 together constitute the third sacrificial film CPL"'. The portion CPL3.4 of the third light extraction material layer located in the light-transmissive region P4 and the portions CPL3.3 of the third light extraction material layer located in the third sub-pixel regions P3 are located on the second sacrificial film CPL"; and the portions CPL3.2 of the third light extraction material layer located in the second sub-pixel regions P2 are located on the third isolation columns Z3.

As shown in FIG. 19L, the third isolation columns Z3, the second isolation columns Z2 and the first isolation column Z1 together separate the third sacrificial film CPL''' from the third light extraction film CPL3.0.

S36 may include S361.

In S361, the first isolation column Z1, the second isolation columns Z2, the third isolation columns Z3, the cathode sacrificial layer and the first sacrificial film CPL' that cover the first isolation column Z1, the second sacrificial film CPL" that covers the second isolation columns Z2, and the third sacrificial film CPL''' that covers the third isolation columns Z3 are removed.

After S361 is completed, as shown in FIG. 19M, the first light extraction portion CPL1 located in the first sub-pixel region P1, the second light extraction portion CPL2 located in the second sub-pixel region P2 and the third light extraction portion CPL3 located in the third sub-pixel region P3 are formed on the display substrate.

The portion CPL1.1 of the first light extraction material layer, the portion CPL2.1 of the second light extraction material layer and a portion CPL3.1 of the third light extraction material layer that are retained in the first sub-pixel region P1 together constitute the first light extraction portion CPL1. The portion CPL1.2 of the first light extraction material layer and the portion CPL2.2 of the second light extraction material layer that are retained in the second sub-pixel region P2 together constitute the second light extraction portion CPL2. The portion CPL1.3 of the first light extraction material layer retained in the third sub-pixel region P3 serves as the third light extraction portion CPL3.

In the second direction Y, the dimension of the third light extraction portion CPL3 is the dimension of the first light extraction film. In the second direction Y, the dimension of the second light extraction portion CPL2 is the sum of the dimension of the first light extraction film and the dimension of the second light extraction film. In the second direction Y, the dimension of the first light extraction portion CPL1 is a sum of the dimension of the first light extraction film, the dimension of the second light extraction film and a dimension of the third light extraction film.

In some examples, the thickness of the portion of the light extraction layer CPL corresponding to the optimum light exit efficiency of the first light-emitting device LD1 is 900 Å, the thickness of the portion of the light extraction layer CPL corresponding to the optimum light exit efficiency of the second light-emitting device LD2 is 650 Å, and the thickness of the portion of the light extraction layer CPL corresponding to the optimum light exit efficiency of the third light-emitting device LD3 is 550 Å.

For example, in the second direction Y, the dimension of the first light extraction film is 550 Å, the dimension of the second light extraction film is 100 Å, and the dimension of the third light extraction film is 250 Å. Thus, the thickness of the third light extraction portion CPL3 is 550 Å, and the light exit efficiency in the third sub-pixel region P3 is optimal; the thickness of the second light extraction portion CPL2 is 650 Å, and the light exit efficiency in the second sub-pixel region P2 is optimal; and the thickness of the first light extraction portion CPL1 is 900 Å, and the light exit efficiency in the first sub-pixel region P1 is optimal.

In the embodiments, the first isolation column Z1, the second isolation columns Z2, third isolation columns Z3 may be removed together, the cathode sacrificial layer and the first sacrificial film that cover the first isolation column Z1, the second sacrificial film that covers the second isolation columns Z2, and the third sacrificial film that covers the third isolation columns Z3 are removed together in a process of removing the first isolation column Z1, the second isolation columns Z2 and the third isolation columns Z3. In this way, it is possible to reduce the number of times the isolation columns are stripped from the cathode layer, thereby improving the light output performance of the display substrate.

In some embodiments, an isolation column is formed on the electron transport layer ETL. The inventors of the present disclosure have found through research that, the removal of the isolation columns from the electron transport layer ETL deteriorates the performance of the electron transport layer ETL, which results in a decrease in the light exit efficiency of the light-emitting device.

TABLE 3

| Test voltage (15 mA/cm$^2$) | Voltage ratio | Light exit efficiency | Sampling coordinates |
|---|---|---|---|
| Reference ETL | 100% | 100% | 0.226, 0.729 |
| ETL after the isolation columns are removed from ETL | 183% | 80% | 0.238, 0.706 |

It can be seen from Table 2 that, after the isolation column is removed from the electron transport layer ETL, the electron transport layer ETL has an increase in the test voltage ratio. In this case, the light exit efficiency is lower than a reference light exit efficiency. The isolation column deteriorate the performance of the electron transport layer ETL, which results in the decrease in the light exit efficiency of the light-emitting device.

In the embodiments, the isolation column is arranged on the cathode layer CE, which can avoid damage to the electron transport layer ETL when the isolation column is removed, thereby ensuring the light exit efficiency of the light-emitting device LD. As a result, the light exit efficiency of the display substrate 200 is improved.

In the embodiments, the light extraction portions with different dimensions in the second direction Y can be formed on the display substrate, and the dimensions, in the second direction Y, of the light extraction portions in different sub-pixel regions can be adaptively adjusted, so that the light exit efficiencies in the sub-pixel regions are improved. As a result, the light exit efficiency of the display substrate 200 can be improved.

The foregoing descriptions are merely specific implementation manners of the present disclosure, but the protection scope of the present disclosure is not limited thereto. Changes or replacements that any person skilled in the art could readily conceive of within the technical scope of the present disclosure shall all be included in the protection scope of the present disclosure. Therefore, the protection scope of the present disclosure shall be subject to the protection scope of the claims.

What is claimed is:

1. A display substrate, comprising:

a base, wherein the base includes first sub-pixel regions, second sub-pixel regions and third sub-pixel regions that display different colors;

a light-emitting device layer located on a side of the base, wherein the light-emitting device layer includes first light-emitting devices, second light-emitting devices and third light-emitting devices that emit light of different colors, a first light-emitting device in the first light-emitting devices is located in a first sub-pixel region in the first sub-pixel regions, a second light-emitting device in the second light-emitting devices is located in a second sub-pixel region in the second sub-pixel regions, and a third light-emitting device in the third light-emitting devices is located in a third sub-pixel region in the third sub-pixel regions; and a light extraction layer located on a side of the light-emitting device layer away from the base, wherein the light extraction layer includes first light extraction portions, second light extraction portions and third light extraction portions, a first light extraction portion in the first light extraction portions is located in the first sub-pixel region, a second light extraction portion in the second light extraction portions is located in the second sub-pixel region, and a third light extraction portion in the third light extraction portions is located in the third sub-pixel region, wherein at least two of the first light extraction portion, the second light extraction portion and the third light extraction portion have different dimensions in a thickness direction of the base;

two sub-pixel regions displaying a same color are adjacently arranged, and a light-transmissive region is provided between the two sub-pixel regions that are adjacently arranged;

one of the first light extraction portion, the second light extraction portion and the third light extraction portion covers the two sub-pixel regions displaying the same color and the light-transmissive region located between the two sub-pixel regions displaying the same color.

2. The display substrate according to claim 1, wherein in the thickness direction of the base, a dimension of the first light extraction portion is greater than a dimension of the second light extraction portion, and the dimension of the second light extraction portion is greater than a dimension of the third light extraction portion.

3. The display substrate according to claim 2, wherein the light-emitting device layer includes an anode, a cathode layer, and an organic layer located between the anode and the cathode layer; and the organic layer includes first organic layers, second organic layers and third organic layers that are made of different materials; a first organic layer in the first organic layers is located in the first sub-pixel region, a second organic layer in the second organic layers is located in the second sub-pixel region, and a third organic layer in the third organic layers is located in the third sub-pixel region, wherein at least two of the first organic layer, the second organic layer and the third organic layer have different dimensions in the thickness direction of the base.

4. The display substrate according to claim 3, wherein in the thickness direction of the base, a dimension of the first organic layer is greater than a dimension of the second organic layer, and the dimension of the second organic layer is greater than a dimension of the third organic layer.

5. The display substrate according to claim 1, wherein surfaces, away from the base, of at least two of the first light extraction portion, the second light extraction portion and the third light extraction portion have different average distances from the base.

6. The display substrate according to claim 5, wherein surfaces, away from the base, of the first light extraction portion, the second light extraction portion and the third light extraction portion have different average distances from the base.

7. The display substrate according to claim 5, wherein an average distance between the base and a surface of the first light extraction portion away from the base is greater than an average distance between the base and a surface of the second light extraction portion away from the base, and the average distance between the base and the surface of the second light extraction portion away from the base is greater than an average distance between the base and a surface of the third light extraction portion away from the base.

8. The display substrate according to claim 1, wherein the light-emitting device layer includes:

a cathode layer including first cathode portions, second cathode portions and third cathode portions, wherein a first cathode portion in the first cathode portions is located in the first sub-pixel region, a second cathode portion in the second cathode portions is located in the second sub-pixel region, and a third cathode portion in the third cathode portions is located in the third sub-pixel region, wherein in the thickness direction of the base, a dimension of the first cathode portion, a dimension of the second cathode portion and a dimension of the third cathode portion are substantially equal.

9. The display substrate according to claim 8, wherein the base further includes a light-transmissive region located between the first sub-pixel region, the second sub-pixel region and the third sub-pixel region;

the cathode layer further includes a fourth cathode portion located in the light-transmissive region located between the first sub-pixel region, the second sub-pixel region and the third sub-pixel region; and in the thickness direction of the base, the dimension of the first cathode portion is greater than or substantially equal to a dimension of the fourth cathode portion.

10. The display substrate according to claim 9, wherein an orthographic projection of the light extraction layer on the base does not overlap with an orthographic projection of the fourth cathode portion on the base; or the display substrate further comprises an encapsulation layer covering the light extraction layer, wherein the encapsulation layer is in direct contact with the fourth cathode portion.

11. The display substrate according to claim 1, further comprising:

an encapsulation layer including first encapsulation portions, second encapsulation portions and third encapsulation portions, wherein a first encapsulation portion in the first encapsulation portions is located in the first sub-pixel region, a second encapsulation portion in the second encapsulation portions is located in the second sub-pixel region, and a third encapsulation portion in the third encapsulation portions is located in the third sub-pixel region, at least two of the first encapsulation portion, the second encapsulation portion and the third encapsulation portion have different dimensions in the thickness direction of the base.

12. The display substrate according to claim 11, wherein the base further includes a light-transmissive region located between the first sub-pixel region, the second sub-pixel region and the third sub-pixel region;

the encapsulation layer further includes a fourth encapsulation portion located in the light-transmissive region located between the first sub-pixel region, the second sub-pixel region and the third sub-pixel region, wherein in the thickness direction of the base, a dimension of the fourth encapsulation portion is greater than each of a dimension of the first encapsulation portion, a dimension of the second encapsulation portion and a dimension of the third encapsulation portion.

13. The display substrate according to claim 1, wherein the two sub-pixel regions displaying the same color and the light-transmissive region located between the two sub-pixel regions displaying the same color each have an organic layer and a cathode portion therein; and a material of an organic layer in the light-transmissive region located between the two sub-pixel regions displaying the same color is the same as a material of organic layers in the two sub-pixel regions displaying the same color.

14. A display apparatus, comprising the display substrate according to claim 1.

15. A method for manufacturing a display substrate, the method comprising:

providing a base, wherein the base includes first sub-pixel regions, second sub-pixel regions, third sub-pixel regions, and a light-transmissive region located between a first sub-pixel region in the first sub-pixel regions, a second sub-pixel region in the second sub-pixel regions and a third sub-pixel region in the third sub-pixel regions;

forming a light-emitting device layer on the base, wherein the light-emitting device layer includes first light-emitting devices, second light-emitting devices and third light-emitting devices; a first light-emitting device in the first light-emitting devices is located in the first sub-pixel region, a second light-emitting device in the second light-emitting devices is located in the second sub-pixel region, and a third light-emitting device in the third light-emitting devices is located in the third sub-pixel region; and forming a light extraction layer on a side of the light-emitting device layer away from the base, wherein the light extraction layer includes first light extraction portions, second light extraction portions and third light extraction portions; a first light extraction portion in the first light extraction portions is located in the first sub-pixel region, a second light extraction portion in the second light extraction portions is located in the second sub-pixel region, and a third light extraction portion in the third light extraction portions is located in the third sub-pixel region; at least two of the first light extraction portion, the second light extraction portion and the third light extraction portion have different dimensions in a thickness direction of the base;

wherein two sub-pixel regions displaying a same color are adjacently arranged, and the base further includes a light-transmissive region located between the two sub-pixel regions that are adjacently arranged;

one of the first light extraction portion, the second light extraction portion and the third light extraction portion covers the two sub-pixel regions displaying the same color and the light-transmissive region located between the two sub-pixel regions displaying the same color.

16. The method according to claim 15, wherein forming the light extraction layer includes:

forming a first light extraction film on the side of the light-emitting device layer away from the base, wherein the first light extraction film is located in the first sub-pixel regions, the second sub-pixel regions and the third sub-pixel regions; and forming a second light extraction film on a side of the first light extraction film away from the base, wherein the second light extraction film covers one or two kinds of the first sub-pixel regions, the second sub-pixel regions and the third sub-pixel regions.

17. The method according to claim 15, wherein forming the light-emitting device layer on the base includes:

forming a first cathode material layer on the base, wherein the first cathode material layer covers the first sub-pixel regions, the second sub-pixel regions, the third sub-pixel regions and the light-transmissive region located between the first sub-pixel region, the second sub-pixel region and the third sub-pixel region;

forming, on the first cathode material layer, a first isolation column located in the light-transmissive region; and forming a second cathode material layer on a side, away from the base, of the first isolation column and the first cathode material layer, wherein the second cathode material layer includes a cathode film and a cathode sacrificial layer; the cathode film covers the first sub-pixel regions, the second sub-pixel regions and the third sub-pixel regions, and the cathode sacrificial layer covers the first isolation column; the first isolation column separates portions of the cathode film in two adjacent sub-pixel regions.

18. The method according to claim 17, wherein forming the light extraction layer includes:

forming a first light extraction material layer, wherein the first light extraction material layer includes a first light extraction film and a first sacrificial film; the first light extraction film is located in the first sub-pixel regions, the second sub-pixel regions and the third sub-pixel regions, and the first sacrificial film covers the cathode sacrificial layer; the first isolation column separates the first light extraction film and the first sacrificial film;

forming, on the first light extraction material layer, second isolation columns located in the third sub-pixel regions;

forming a second light extraction material layer, wherein the second light extraction material layer includes a second light extraction film and a second sacrificial film; the second light extraction film is located in the first sub-pixel regions and the second sub-pixel regions, and the second sacrificial film covers the first sacrificial film and the second isolation columns; the second isolation columns separate the second light extraction film and the second sacrificial film; and removing the first isolation column, the second isolation columns, the cathode sacrificial layer and the first sacrificial film that cover the first isolation column, and the second sacrificial film that covers the second isolation columns, so as to form first light extraction portions located in the first sub-pixel regions, second light extraction portions located in the second sub-pixel region and third light extraction portions located in the third sub-pixel region.

19. The method according to claim 18, wherein after forming the second light extraction material layer, forming the light extraction layer further includes:

forming, on the second light extraction material layer, third isolation columns located in the second sub-pixel regions; and forming a third light extraction material layer, wherein the third light extraction material layer includes a third light extraction film and a third sacrificial film; the third light extraction film is located in the first sub-pixel regions, and the third sacrificial film covers the second sacrificial film and the third isolation columns; the third isolation columns separate the third light extraction film and the third sacrificial film; and removing the first isolation column, the second isolation columns, the cathode sacrificial layer and the first sacrificial film that cover the first isolation column, and the second sacrificial film that covers the second isolation columns, includes:

removing the first isolation column, the second isolation columns, the third isolation columns, the cathode sacrificial layer and the first sacrificial film that cover the first isolation column, the second sacrificial film that covers the second isolation columns, and the third sacrificial film that covers the third isolation columns.

* * * * *